United States Patent
Kang et al.

(10) Patent No.: US 11,967,269 B2
(45) Date of Patent: Apr. 23, 2024

(54) SCAN DRIVER

(71) Applicant: SAMSUNG DISPLAY CO., LTD., Yongin-si (KR)

(72) Inventors: Chul Kyu Kang, Yongin-si (KR); Sung Hwan Kim, Yongin-si (KR); Soo Hee Oh, Yongin-si (KR); Dong Sun Lee, Yongin-si (KR); Sang Moo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/938,031

(22) Filed: Oct. 4, 2022

(65) Prior Publication Data

US 2023/0022857 A1     Jan. 26, 2023

Related U.S. Application Data

(63) Continuation of application No. 17/339,808, filed on Jun. 4, 2021, now Pat. No. 11,468,826, which is a
(Continued)

(30) Foreign Application Priority Data

Nov. 30, 2018   (KR) .................. 10-2018-0152855

(51) Int. Cl.
  *G06F 3/01*   (2006.01)
  *G09G 3/32*   (2016.01)

(52) U.S. Cl.
  CPC ....... *G09G 3/32* (2013.01); *G09G 2310/0267* (2013.01); *G09G 2310/08* (2013.01)

(58) Field of Classification Search
  None
  See application file for complete search history.

(56) References Cited

U.S. PATENT DOCUMENTS

| 8,614,661 | B2 | 12/2013 | Tan et al. |
| 9,275,582 | B2 | 3/2016  | Yang et al. |

(Continued)

FOREIGN PATENT DOCUMENTS

| CN | 102467890 A | 5/2012 |
| CN | 104143310 A | 11/2014 |

(Continued)

OTHER PUBLICATIONS

EPO Partial Search Report dated Mar. 12, 2020, for corresponding European Patent Application No. 19212708.2 (24 pages).

*Primary Examiner* — Carl Adams
(74) *Attorney, Agent, or Firm* — Lewis Roca Rothgerber Christie LLP

(57) ABSTRACT

A scan driver includes: a first transistor having a first electrode coupled to an output scan line, a second electrode coupled to a first power line, and a gate electrode coupled to a first node; a second transistor having a first electrode coupled to a first clock line, a second electrode coupled to the output scan line, and a gate electrode coupled to a second node; a third transistor having a first electrode coupled to the first node, a second electrode coupled to a first input scan line, and a gate electrode coupled to a second clock line; and a fourth transistor having a first electrode coupled to the second node and a second electrode and a gate electrode, which are coupled to a second input scan line, wherein the first input scan line and the second input scan line are different from each other.

20 Claims, 19 Drawing Sheets

Related U.S. Application Data continuation of application No. 16/697,690, filed on Nov. 27, 2019, now Pat. No. 11,030,943.

(56) References Cited

U.S. PATENT DOCUMENTS

| | | |
|---|---|---|
| 9,324,272 B2 | 4/2016 | Liu |
| 9,646,539 B2 | 5/2017 | Eom |
| 9,990,883 B2 | 6/2018 | Park et al. |
| 2011/0199354 A1 | 8/2011 | Iwase et al. |
| 2011/0273418 A1 | 11/2011 | Park |
| 2011/0273434 A1 | 11/2011 | Park |
| 2012/0105397 A1 | 5/2012 | Tan et al. |
| 2013/0002309 A1* | 1/2013 | Lee .................. G11C 19/28 327/108 |
| 2013/0009919 A1 | 1/2013 | Park et al. |
| 2014/0111092 A1 | 4/2014 | Kim |
| 2014/0355733 A1 | 12/2014 | Kim et al. |
| 2016/0049106 A1 | 2/2016 | Connell et al. |
| 2016/0063955 A1 | 3/2016 | Yamamoto et al. |
| 2017/0263188 A1* | 9/2017 | Na .................. G09G 3/3258 |
| 2018/0330673 A1 | 11/2018 | Kang et al. |
| 2020/0152127 A1 | 5/2020 | Kang et al. |
| 2020/0168160 A1 | 5/2020 | Oh et al. |

FOREIGN PATENT DOCUMENTS

| | | |
|---|---|---|
| CN | 104851386 A | 8/2015 |
| KR | 10-2020-0055206 | 5/2020 |
| KR | 10-2020-0061469 | 6/2020 |

\* cited by examiner

SCAN DRIVER

CROSS-REFERENCE TO RELATED APPLICATIONS

This application is a continuation of U.S. patent application Ser. No. 17/339,808, filed Jun. 4, 2021, which is a continuation of U.S. patent application Ser. No. 16/697,690, filed Nov. 27, 2019, now U.S. Pat. No. 11,030,943, which claims priority to and the benefit of Korean Patent Application No. 10-2018-0152855, filed Nov. 30, 2018, the entire content of all of which is incorporated herein by reference.

BACKGROUND

1. Field

The present disclosure generally relates to a scan driver.

2. Related Art

With the development of information technologies, the importance of a display device, which is a connection medium between a user and information, has increased. Accordingly, display devices such as liquid crystal display devices, organic light emitting display devices, and plasma display devices are increasingly used.

Each pixel of a display device may emit light with a luminance corresponding to a data voltage input through a data line. The display device may display an image frame with a combination of light emitting pixels.

A plurality of pixels may be coupled to each data line. Therefore, a scan driver is required, which provides a scan signal for selecting a pixel to which a data voltage is to be supplied among the plurality of pixels.

The scan signal of the scan driver may be used a control signal for various operating phases of the pixel, in addition to the selection of the pixel to which the data voltage is to be supplied.

The Background section of the present Specification includes information that is intended to provide context to example embodiments, and the information in the present Background section does not necessarily constitute prior art.

SUMMARY

Aspects of some example embodiments include a scan driver capable of supplying a scan signal having a turn-on level with respect to an N-type transistor.

According to some example embodiments of the present disclosure, a scan driver includes: a first transistor having one electrode coupled to an output scan line, the other electrode coupled to a first power line, and a gate electrode coupled to a first node; a second transistor having one electrode coupled to a first clock line, the other electrode coupled to the output scan line, and a gate electrode coupled to a second node; a third transistor having one electrode coupled to the first node, the other electrode coupled to a first input scan line, and a gate electrode coupled to a second clock line; and a fourth transistor having one electrode coupled to the second node and the other electrode and a gate electrode, which are coupled to a second input scan line, wherein the first input scan line and the second input scan line are different from each other.

According to some example embodiments, the scan driver may further include: a fifth transistor having one electrode coupled to the first clock line, the other electrode coupled to the second node, and a gate electrode coupled to the first node; and a first capacitor having one electrode coupled to the first clock line and the other electrode coupled to the second node.

According to some example embodiments, the scan driver may further include: a second capacitor having one electrode coupled to a third node and the other electrode coupled to the first node; and a sixth transistor having one electrode coupled to the third node, the other electrode coupled to a third clock line, and a gate electrode coupled to the first node.

According to some example embodiments, the scan driver may further include a seventh transistor having one electrode coupled to a second power line, the other electrode coupled to the third node, and a gate electrode coupled to a fourth clock line.

According to some example embodiments, the scan driver may further include a seventh transistor having one electrode coupled to the third clock line, the other electrode coupled to the third node, and a gate electrode coupled to a fourth clock line.

According to some example embodiments, the scan driver may further include an eighth transistor having one electrode coupled to the second node, the other electrode coupled to the one electrode of the fourth transistor, and a gate electrode coupled to a control line.

According to some example embodiments, the scan driver may further include a ninth transistor having one electrode coupled to the first node, the other electrode coupled to the one electrode of the third transistor, and a gate electrode coupled to the first power line.

According to some example embodiments, the scan driver may further include: a tenth transistor having one electrode coupled to the second power line, the other electrode coupled to the other electrode of the fourth transistor, and a gate electrode coupled to the second input scan line; and an eleventh transistor having one electrode coupled to the other electrode of the fourth transistor, the other electrode coupled to the first power line, and a gate electrode coupled to the second input scan line.

According to some example embodiments, the pulses of a first scan signal input to the first input scan line may have a phase faster than that of pulses of a second scan signal input to the second input scan line.

According to some example embodiments, the pulses of the second scan signal may overlap with some pulses of a first clock signal input to the first clock line for a partial time.

According to some example embodiments, times at which the pulses of the second scan signal are generated may be prior to those at which the some pulses of the first clock signal are generated.

According to some example embodiments, a second clock signal input to the second clock line may have the same period length as a third clock signal input to the third clock line, but have a phase faster than that of the third clock signal.

According to some example embodiments, the pulses of the first clock signal may have a polarity opposite to that of pulses of the third clock signal. The pulses of the first clock signal and the pulses of the third clock signal may overlap with each other for a partial time. The pulses of the first clock signal may have a phase delayed from that of the pulses of the third clock signal.

According to some example embodiments, a fourth clock signal may be input to the fourth clock line. Pulses of the fourth clock signal may have a polarity opposite to that of the pulses of the first clock signal. The pulses of the fourth clock signal and the pulses of the first clock signal may overlap with each other for a partial time. The pulses of the fourth clock signal may have a phase delayed from that of the pulses of the first clock signal.

According to some example embodiments, the pulses of the first clock signal may have a polarity opposite to that of the pulses of the third clock signal. The pulses of the first clock signal may be generated for times at which the pulses of the third clock signal are generated. The times at which the pulses of the first clock signal are generated may be delayed from those at which the pulses of the third clock signal are generated.

According to some example embodiments, a fourth clock signal may be input to the fourth clock line. Pulses of the fourth clock signal may have a polarity opposite to that of the pulses of the first clock signal. The pulses of the fourth clock signal may not temporally overlap with the pulses of the first clock signal.

According to some example embodiments, the in a first driving mode, a control signal applied to the control line may maintain a turn-on level during one period including a plurality of image frames.

According to some example embodiments, in a second driving mode different from the first driving mode, the control signal may maintain the turn-on level during a partial period of one image frame in the one period, and maintain a turn-off level in other image frames in the one period.

According to some example embodiments, in a second driving mode different from the first driving mode, the control signal may maintain the turn-on level during the one period. The first clock signal input to the first clock line may include pulses during a partial period of one image frame in the one period, and may not include the pulses in other image frames in the one period.

According to some example embodiments, the pulses of the first scan signal input to the first input scan line may have a phase faster than that of the pulses of the second scan signal input to the second input scan line. The pulses of the first scan signal and the pulses of the second scan signal may have the same polarity.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
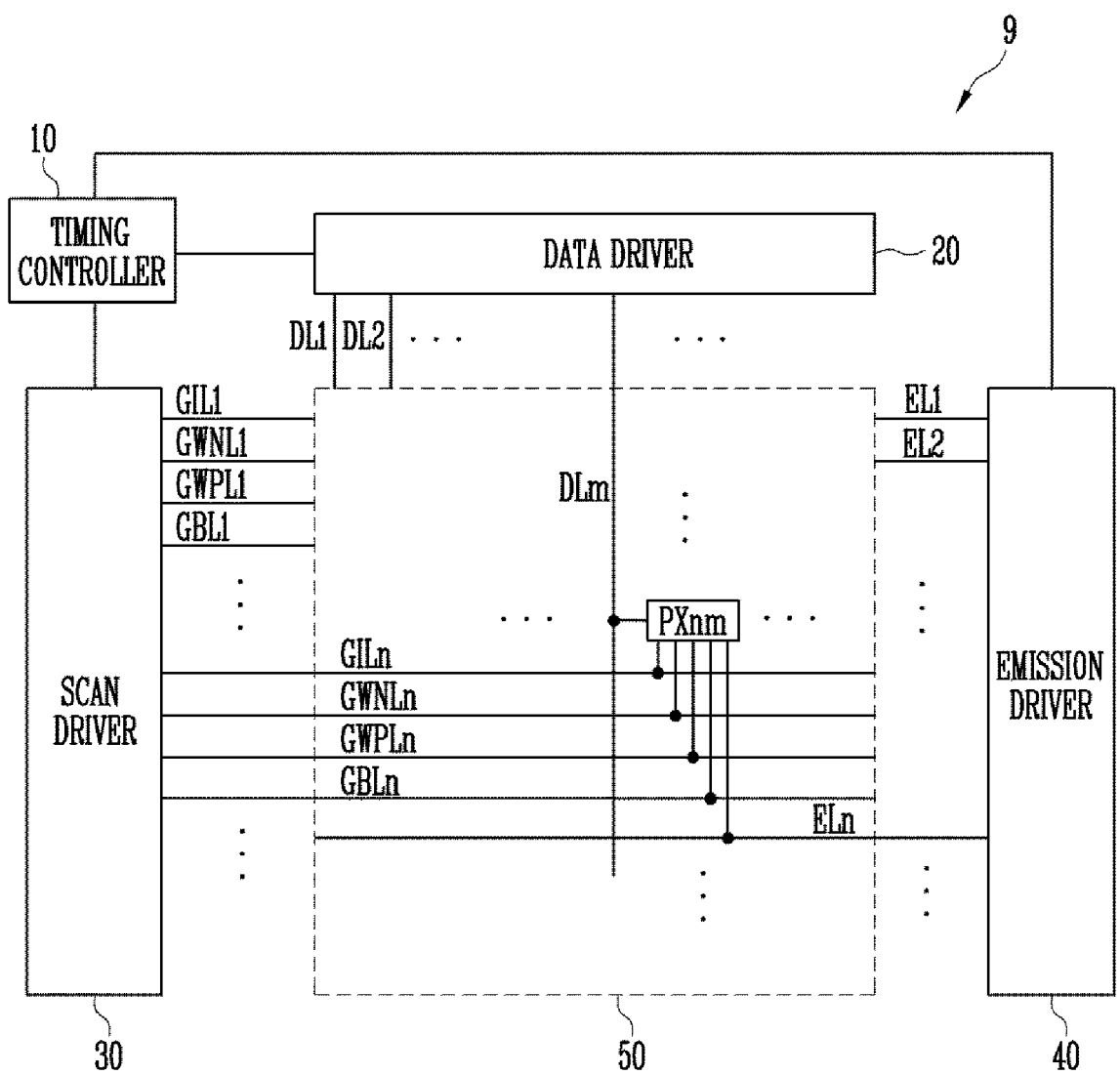
FIG. 1 is a diagram illustrating a display device according to some example embodiments of the present disclosure.

Hereinafter, aspects of some example embodiments are described in more detail with reference to the accompanying drawings so that those skilled in the art may easily practice the present disclosure. The present disclosure may be implemented in various different forms and is not limited to the example embodiments described in the present specification.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

FIG. 1 is a diagram illustrating a display device according to some example embodiments of the present disclosure.

Referring to FIG. 1, the display device 9 according to some example embodiments of the present disclosure may include a timing controller 10, a data driver 20, a scan driver 30, an emission driver 40, and a pixel unit 50.

The timing controller 10 may provide grayscale values and control signals to the data driver 20 to be suitable for specifications of the data driver 20. Also, the timing controller 10 may provide a clock signal, a scan start signal, etc., to the scan driver 30 to be suitable for specifications of the scan driver 30. Also, the timing controller 11 may provide a clock signal, an emission stop signal, etc., to the emission driver 40 to be suitable for specifications of the emission driver 40.

The data driver 20 may generate data voltages to be provided to data lines DL1, DL2, DLm, . . . , using the grayscale values and control signals, which are received from the timing controller 10. For example, the data driver 20 may sample grayscale values, using a clock signal, and apply data voltages corresponding to the grayscale values to the data lines DL1, DL2, DLm, . . . in units of pixel rows. Here, m may be a natural number greater than zero.

The scan driver 30 may generate scan signals to be provided to scan lines GIL1, GWNL1, GWPL1, GBL1, GILn, GWNLn, GWPLn, GBLn, . . . by receiving the clock signal, the scan start signal, etc. from the timing controller 10. Here, n may be a natural number greater than zero.

The scan driver 30 may include a plurality of sub-scan drivers. In an example, a first sub-scan driver may provide scan signals for the scan lines GIL1, GILn, . . . , a second sub-scan driver may provide scan signals for the scan lines GWNL1, GWNLn, . . . , a third sub-scan driver may provide scan signals for the scan lines GWPL1, GWPLn, . . . , and a fourth sub-scan driver may provide scan signals for the scan lines GBL1, GBLn, . . . .

In another example, the first and second sub-scan drivers may be integrated to provide scan signals for the scan lines GIL1, GWNL1, GILn, GWLn, . . . , and the third and fourth sub-scan drivers may be integrated to provide scan signals for the scan lines GWPL1, GBL1, GWPLn, GBL1, . . . . For example, a previous scan line of an nth scan line GWNLn, i.e., an (n−1)th scan line may be coupled to the same electrical node as an nth scan line GILn. Also, for example, a next scan line of an nth scan line GWPLn, i.e., an (n+1)th scan line may be coupled to the same electrical node as an nth scan line GBLn.

The first and second sub-scan drivers may supply scan signals having pulses of a first polarity to the scan lines GIL1, GWNL1, GILn, GWNLn, . . . . In addition, the third and fourth sub-scan drivers may supply scan signals having pulses of a second polarity to the scan lines GWPL1, GBL1, GWPLn, GBLn, . . . . The first polarity and the second polarity may be polarities opposite to each other.

Hereinafter, a polarity may mean a logic level of a pulse. For example, when the pulse has the first polarity, the pulse may have a high level. The pulse having the high level may be referred to as a rising pulse. When the rising pulse is supplied to a gate electrode of an N-type transistor, the N-type transistor may be turned on. That is, the rising pulse may have a turn-on level with respect to the N-type transistor. A case where a voltage having a level sufficiently lower than that of the gate electrode of the N-type transistor is applied to a source electrode of the N-type transistor is assumed. For example, the N-type transistor may be an NMOS transistor.

In addition, when the pulse has the second polarity, the pulse may have a low level. The pulse having the low level may be referred to as a falling pulse. When the falling pulse is supplied to a gate electrode of a P-type transistor, the P-type transistor may be turned on. That is, the falling pulse may be a turn-on level with respect to the P-type transistor. A case where a voltage having a level sufficiently higher than that of the gate electrode of the P-type transistor is applied to a source electrode of the P-type transistor is assumed. For example, the P-type transistor may be a PMOS transistor.

The emission driver 40 may generate emission signals to be provided to emission lines EL1, EL2, . . . , and ELn, . . . by receiving the clock signal, the emission stop signal, etc. from the timing controller 10. For example, the emission driver 40 may sequentially provide the emission signals having a turn-off level pulse to the emission lines EL1, EL2, . . . , and ELn, . . . . For example, the emission driver 40 may be configured in the form of a shift register, and generate the emission signals in a manner that sequentially transfers a turn-off level pulse of the emission stop signal to a next emission stage under the control of the clock signal.

The pixel unit 50 includes pixels. For example, a pixel PXnm may be coupled to a corresponding data line DLm, corresponding scan lines GILn, GWNLn, GWPLn, and GBLn, and a corresponding emission line ELn.

Figure 2:
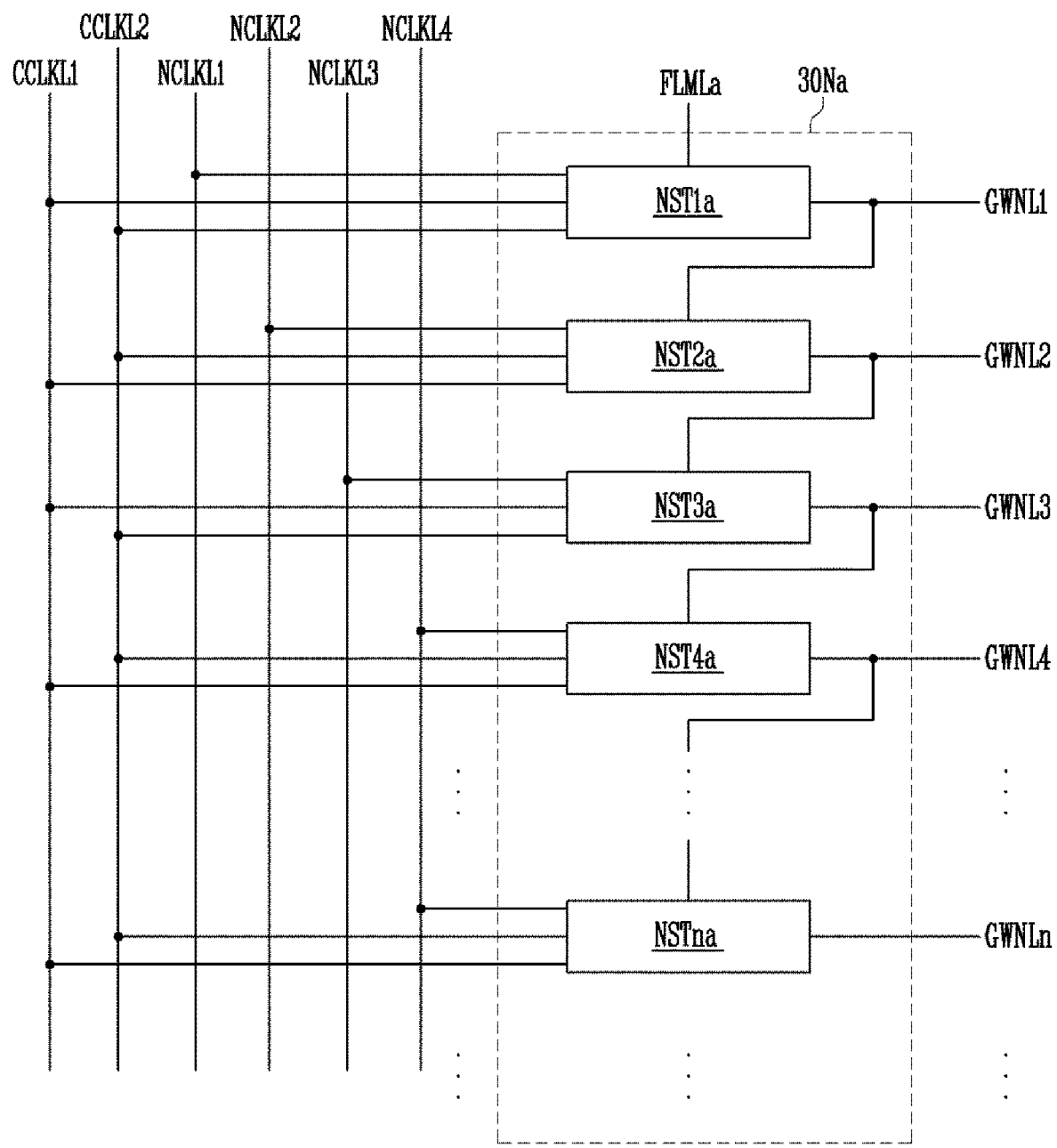
FIG. 2 is a diagram illustrating a scan driver according to some example embodiments of the present disclosure.

FIG. 2 is a diagram illustrating a scan driver according to some example embodiments of the present disclosure.

The scan driver 30Na shown in FIG. 2 may correspond to the second sub-scan driver described with reference to FIG. 1. According to some example embodiments, the first sub-scan driver described with reference to FIG. 1 may be implemented by replacing the scan lines GWNL1, GWNL2, GWNL3, GWNL4, GWNLn, . . . , which are shown in FIG. 2, with the scan lines GIL1, GILn, . . . .

Referring to FIG. 2, the scan driver 30Na may include scan stages NST1a, NST2a, NST3a, NST4a, NSTna, . . . . Each of the scan stages NST1a, NST2a, NST3a, NST4a, NSTna, . . . may be coupled to corresponding clock lines CCLKL1 and CCLKL2, a corresponding one of clock lines NCLK1, NCLK2, NCLK3, and NCLK4, and a previous end scan line. However, a first scan stage NST1a has no previous end scan line, and hence may be coupled to a scan start line FLMLa.

The scan stages NST1a, NST2a, NST3a, NST4a, NSTna, . . . may be coupled to each other in the form of a shift register. For example, scan signals may be generated in a manner that sequentially transfers a turn-on level pulse of the scan start signal supplied to the scan start line FLMLa to a next scan stage.

Figure 3:
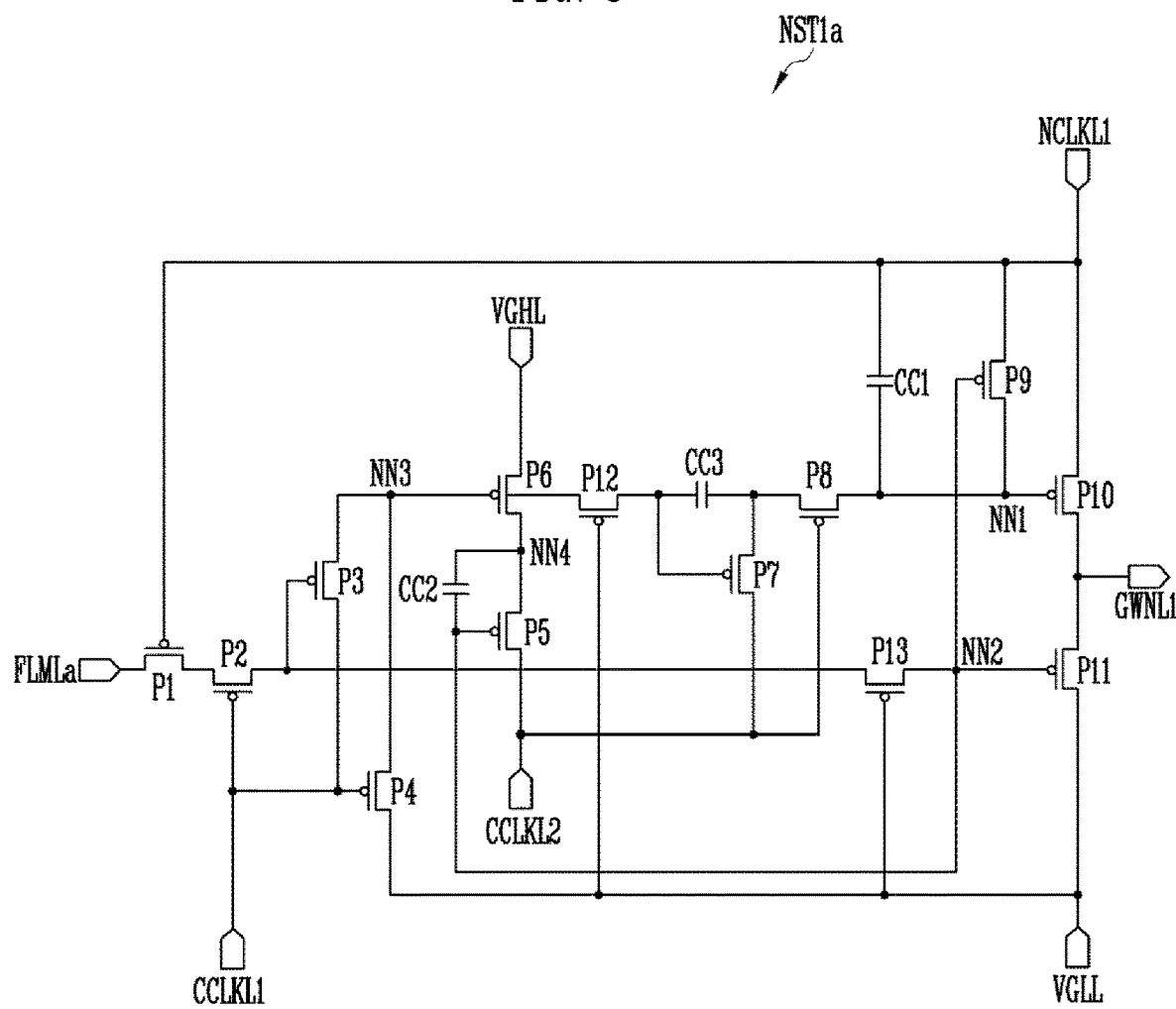
FIG. 3 is a diagram illustrating a scan stage of the scan driver shown in FIG. 2.

FIG. 3 is a diagram illustrating a scan stage of the scan driver shown in FIG. 2.

Referring to FIG. 3, an example of the first scan stage NST1a of the scan driver 30Na shown in FIG. 2 is illustrated. The other scan stages NST2a, NST3a, NST4a, NSTna, . . . , which are shown in FIG. 2, have the substantially same configuration as the scan stage NST1a, and therefore, overlapping descriptions will be omitted.

The scan stage NST1a may include transistors P1 to P13 and capacitors CC1 to CC3. The transistors P1 to P13 may be P-type transistors.

One electrode of the transistor P1 may be coupled to the other electrode of the transistor P2, the other electrode of the transistor P1 may be connected to the scan start line FLMLa, and a gate electrode of the transistor P1 may be coupled to the clock line NCLKL1.

One electrode of the transistor P2 may be coupled to the other electrode of the transistor P13, the other electrode of the transistor P2 may be coupled to the one electrode of the transistor P1, and a gate electrode of the transistor P2 may be coupled to the control clock line CCLKL1.

One electrode of the transistor P3 may be coupled to a node NN3, the other electrode of the transistor P3 may be coupled to the control clock line CCLKL1, and a gate electrode of the transistor P3 may be coupled to the one electrode of the transistor P2.

The transistor P4 may be coupled to the node NN3, the other electrode of the transistor P4 may be coupled to a power line VGLL, and a gate electrode of the transistor P4 may be coupled to the control clock line CCLKL1.

One electrode of the transistor P5 may be coupled to a node NN4, the other electrode of the transistor P5 may be coupled to the control clock line CCLKL2, and a gate electrode of the transistor P5 may be coupled to a node NN2.

One electrode of the transistor P6 may be coupled to a power line VGHL, the other electrode of the transistor P6 may be coupled to the node NN4, and a gate electrode of the transistor P6 may be coupled to the node NN3.

One electrode of the transistor P7 may be coupled to one electrode of the capacitor CC3, the other electrode of the transistor P7 may be coupled to the control clock line CCLKL2, and a gate electrode of the transistor P7 may be coupled to the other electrode of the capacitor CC3.

One electrode of the transistor P8 may be coupled to a node NN1, the other electrode of the transistor P8 may be coupled to the capacitor CC3, and a gate electrode of the transistor P8 may be coupled to the control clock line CCLKL2.

One electrode of the transistor P9 may be coupled to the clock line NCLKL1, the other electrode of the transistor P9 may be coupled to the node NN1, and a gate electrode of the transistor P9 may be coupled to the node NN2.

One electrode of the transistor P10 may be coupled to the clock line NCLKL1, the other electrode of the transistor P10 may be coupled to the scan line GWNL1, and a gate electrode of the transistor P10 may be coupled to the node NN2.

One electrode of the transistor P11 may be coupled to the scan line GWNL1, the other electrode of the transistor P11 may be coupled to the power line VGLL, and a gate electrode of the transistor P11 may be coupled to the node NN2.

One electrode of the transistor P12 may be coupled to the other electrode of the capacitor CC3, the other electrode of the transistor P12 may be coupled to the node NN3, and a gate electrode of the transistor P12 may be coupled to the power line VGLL.

One electrode of the transistor P13 may be coupled to the node NN2, the other electrode of the transistor P13 may be coupled to the one electrode of the transistor P2, and a gate electrode of the transistor P13 may be coupled to the power line VGLL.

One electrode of the capacitor CC1 may be coupled to the clock line NCLKL1, and the other electrode of the capacitor CC1 may be coupled to the node NN1.

One electrode of the capacitor CC2 may be coupled to the node NN4, and the other electrode of the capacitor CC2 may be coupled to the node NN2.

The one electrode of the capacitor CC3 may be coupled to the one electrode of the transistor P7, and the other electrode of the capacitor CC3 may be coupled to the gate electrode of the transistor P7.

Figure 4:
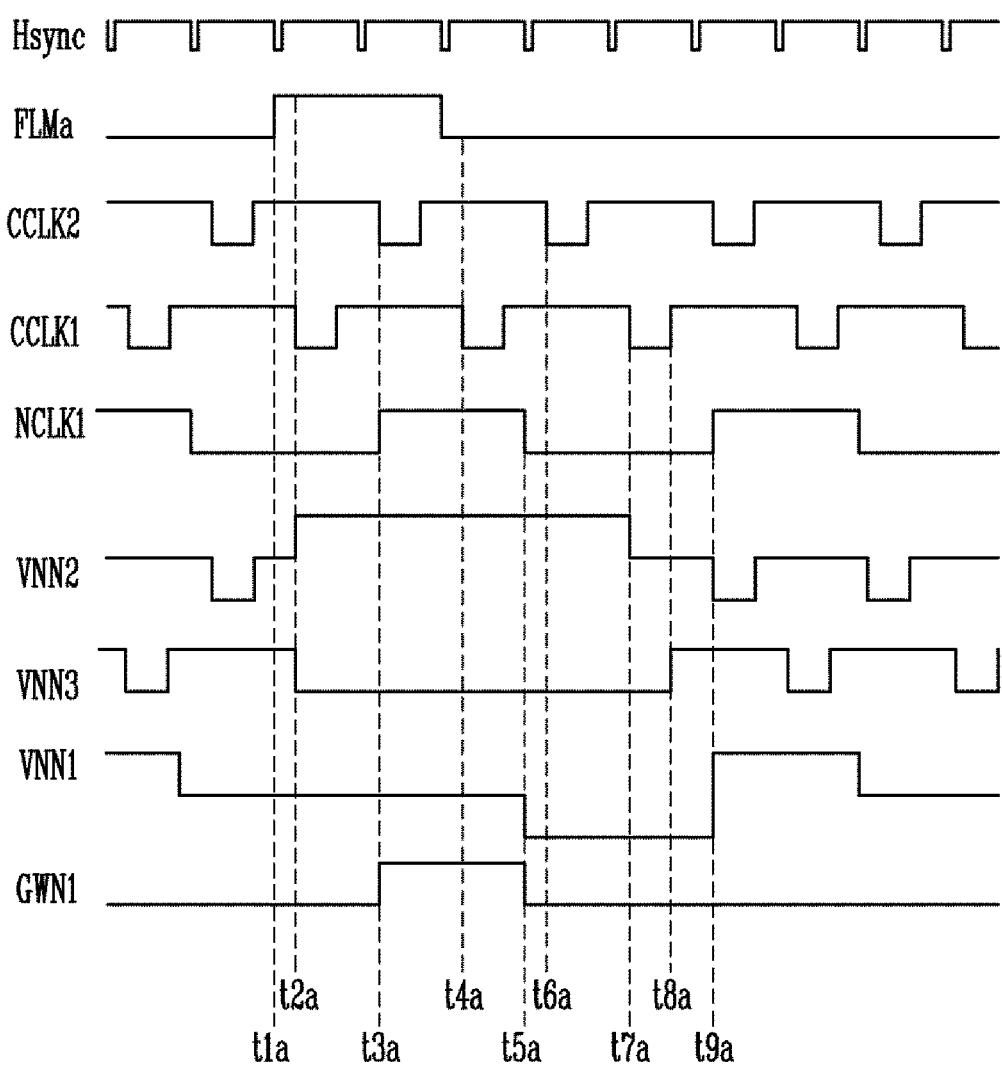
FIG. 4 is a diagram illustrating an example driving method of the scan stage shown in FIG. 3.

FIG. 4 is a diagram illustrating an example driving method of the scan stage shown in FIG. 3.

Referring to FIG. 4, there is illustrated a timing diagram of a scan start signal FLMa applied to the scan start line FLMLa, a control clock signal CCLK2 applied to the control clock line CCLKL2, a control clock signal CCLK1 applied to the control clock line CCLKL1, a clock signal NCLK1 applied to the clock line NCLKL1, a node voltage VNN2 of the node NN2, a node voltage VNN3 of the node NN3, a node voltage VNN1 of the node NN1, and a scan signal GWN1 applied to the scan line GWNL1. A horizontal synchronization signal Hsync is illustrated as a reference signal for timing. An interval between pulses of the horizontal synchronization signal Hsync may be referred to as one horizontal period.

A voltage having a high level may be applied to the power line VGHL, and a voltage having a low level may be applied to the power line VGLL. In the description of the driving method, the transistors P12 and P13 of which gate electrodes are coupled to the power line VGLL are in a turn-on state during a majority of periods, and therefore, descriptions of the transistors P12 and P13 will be omitted except a specific case.

First, at a time t1a, the scan start signal FLMa having the high level is supplied. Because the transistor P1 is in the turn-on state by the clock signal NCLK1 having the low level, the scan start signal FLMa having the high level is supplied to the other electrode of the transistor P2.

At a time t2a, the control clock signal CCLK1 having the low level is supplied. Therefore, the transistors P2 and P4 are turned on.

When the transistor P2 is turned on, the scan start signal FLMa having the high level is transferred to the node NN2, and the node voltage VNN2 becomes the high level. The transistors P3, P5, P9, and P11 are turned off by the node voltage VNN2 having the high level.

When the transistor P4 is turned on, the node NN3 and the power line VGLL are coupled to each other, and hence the node voltage VNN3 becomes the low level. The transistors P6 and P7 are turned on by the node voltage VNN3 having the low level.

When the transistor P6 is turned on, the node NN4 and the power line VGHL are coupled to each other. Hence, the power line VGHL supports one end of the capacitor CC2, and thus the node voltage VNN2 of the node NN2 can be stably maintained.

When the transistor P7 is turned on, the one electrode of the capacitor CC3 and the control clock line CCLKL2 are coupled to each other. Because the control clock signal CCLK2 having the high level is applied to the gate electrode of the transistor P8, the transistor P8 is in a turn-off state, and therefore, the node voltage VNN1 is not changed.

At a time t3a, the clock signal NCLK1 having the high level and the control clock signal CCLK2 having the low level are supplied.

The control clock signal CCLK2 having the low level is supplied to the one electrode of the capacitor CC3 through the transistor P7. A voltage lower than the low level is applied to the gate electrode of the transistor P7 by coupling of the capacitor CC3. Thus, the transistor P7 can stably maintain the turn-on state, and driving characteristics of the transistor P7 can be improved.

According to this embodiment, the node voltage VNN3 is not influenced by the coupling of the capacitor CC3 due to the transistor P12. When a voltage lower than the low level is applied to the one electrode of the transistor P12 by the coupling of the capacitor CC3, the one electrode of the transistor P12 serves as a drain electrode. Therefore, the node NN3 corresponding to the other electrode of the transistor P12 serves as a source electrode. In addition, because the voltage having the low level is applied to the gate electrode of the transistor P12 through the power line VGLL, a voltage higher than the low level is to be applied to the source electrode of the transistor P12 such that the transistor P12 is turned on. Because the node voltage VNN3 of the node NN3 becomes the low level at the current time, the transistor P12 is in the turn-off state.

Thus, according to this embodiment, the node voltage VNN3 is maintained by the transistor P12, so that a transient bias voltage can be prevented from being applied to the transistors P3 and P4. Accordingly, the lifespan of the transistors P3 and P4 can be extended.

In addition, the transistor P8 is turned on by the control clock signal CCLK2 having the low level. Therefore, the node NN1 and the control clock line CCLK2 are coupled to each other through the transistors P7 and P8. Accordingly, the transistor P10 is turned on by the node voltage VNN1 having the low level. The transistor P9 maintains the turn-off state due to the node voltage VNN2 having the high level.

The clock line NCLKL1 and the scan line GWNL1 are coupled to each other through the turned-on transistor P10. Therefore, the clock signal NCLK1 having the high level is supplied as the scan signal GWN1 having the high level to the scan line GWNL1.

Additionally, the transistor P1 maintains the turn-off state until at least a time t5a by the clock signal NCLK1 having the high level. Therefore, although the level of the scan start signal FLMa is then changed to the low level, the node voltage VNN2 maintains the high level.

At a time t4a, the control clock signal CCLK1 having the low level is supplied. Therefore, the transistors P2 and P4 are turned on, and the node voltage VNN3 maintains the low level because the node NN3 is coupled to the power line VGLL.

Although the transistor P2 is turned on, the transistor P1 maintains the turn-off state as described above. Hence, the node voltage VNN2 maintains the high level.

At the time t5a, the clock signal NCLK1 having the low level is supplied. The node voltage VNN1 is lower than the low level due to coupling of the capacitor CC1. Therefore, the transistor P10 stably maintains the turn-on state. Accordingly, the clock signal NCLK1 having the low level is supplied as the scan signal GWN1 having the low level to the scan line GWNL1.

At a time t6a, the control clock signal CCLK2 having the low level is supplied. Therefore, the voltage of the gate electrode of the transistor P7 is dropped to a voltage lower than the low level due to the coupling of the capacitor CC3. Thus, the transistor P7 can stably maintain the turn-on state, and driving characteristics of the transistor P7 can be improved. In addition, as described with reference to the time t3a, the node voltage VNN3 maintains the low level without being influenced by the coupling of the capacitor CC3, and thus a transient bias voltage is prevented from being applied to the transistors P3 and P4.

Because the transistor P8 is turned on, the transistor P10 also maintains the turn-on state due to the control clock signal CCLK2 having the low level, which is transferred through the transistors P7 and P8.

At a time t7a, the control clock signal CCLK1 having the low level is supplied, and the transistors P2 and P4 are turned on. The node NN3 and the power line VGLL are coupled to each other through the transistor P4. Therefore, the node voltage VNN3 maintains the low level, and the node NN4 maintains a state in which it is coupled to the power line VGHL due to the turned-on transistor P6.

Meanwhile, because the transistor P1 is in the turn-on state, the scan start signal FLMa having the low level is supplied to the node NN2. Therefore, the node voltage VNN2 becomes the low level.

The transistors P3, P5, P9, and P11 are turned on by the node voltage VNN2 having the low level.

When the transistor P9 is turned on, the transistor P10 is diode-coupled. Hence, current can flow only from the scan line GWNL1 to the clock line NCLKL1, and thus a change in level of the clock signal NCLK1 has no influence on the scan signal GWN1.

When the transistor P11 is turned on, the power line VGLL is coupled to the scan line GWNL1. Therefore, the scan signal GWN1 having the low level is output from the scan line GWNL1.

At a time t8a, the control clock signal CCLK1 having the high level is supplied. Because the transistor P3 is in the turn-on state, the node NN3 and the control clock line CCLKL1 are coupled to each other. Therefore, the node voltage VNN3 becomes the high level. The transistors P6 and P7 are turned off by the node voltage VNN3 having the high level.

The voltage of the node NN4 is maintained to the high level by the power line VGLL and the capacitor CC2, and therefore, the transistor P5 maintains the turn-on state.

At a time t9a, the control clock signal CCLK2 having the low level and the clock signal NCLK1 having the high level are supplied.

As described above, the transistor P10 maintains the state in which it is diode-coupled due to the transistor P9 maintaining the turn-on state, and therefore, the clock signal NCLK1 having the high level is not transferred to the scan line GWNL1.

The control clock signal CCLK2 having the low level is applied to the node NN4 through the transistor P5 that is in the turn-on state. Therefore, the node voltage VNN2 is lower than the low level due to the coupling of the capacitor CC2. Thus, the transistor P11 can stably maintain the turn-on state, and driving characteristics of the transistor P11 can be improved.

According to this embodiment, a node corresponding to the other electrode of the transistor P13 is not influenced by the coupling of the capacitor CC2 due to the transistor P13. When a voltage lower than the low level due to the coupling of the capacitor CC2 is applied to the node NN2 that is the one electrode of the transistor P13, the one electrode of the transistor P13 serves as a drain electrode. Therefore, the node corresponding to the other electrode of the transistor P13 serves as a source electrode. In addition, because the voltage having the low level is applied to the gate electrode of the transistor P13 through the power line VGLL, a voltage higher than the low level is to be applied to the source electrode of the transistor P13 such that the transistor P13 is turned on. Because the voltage having the low level is applied to the source electrode of the transistor P13 at the current time, the transistor P13 is in the turn-off state.

Thus, according to this embodiment, the voltage of the node corresponding to the other electrode of the transistor P13 is maintained by the transistor P13, so that a transient bias voltage can be prevented from being applied to the transistors P2 and P3. Accordingly, the lifespan of the transistors P2 and P3 can be extended.

Figure 5:
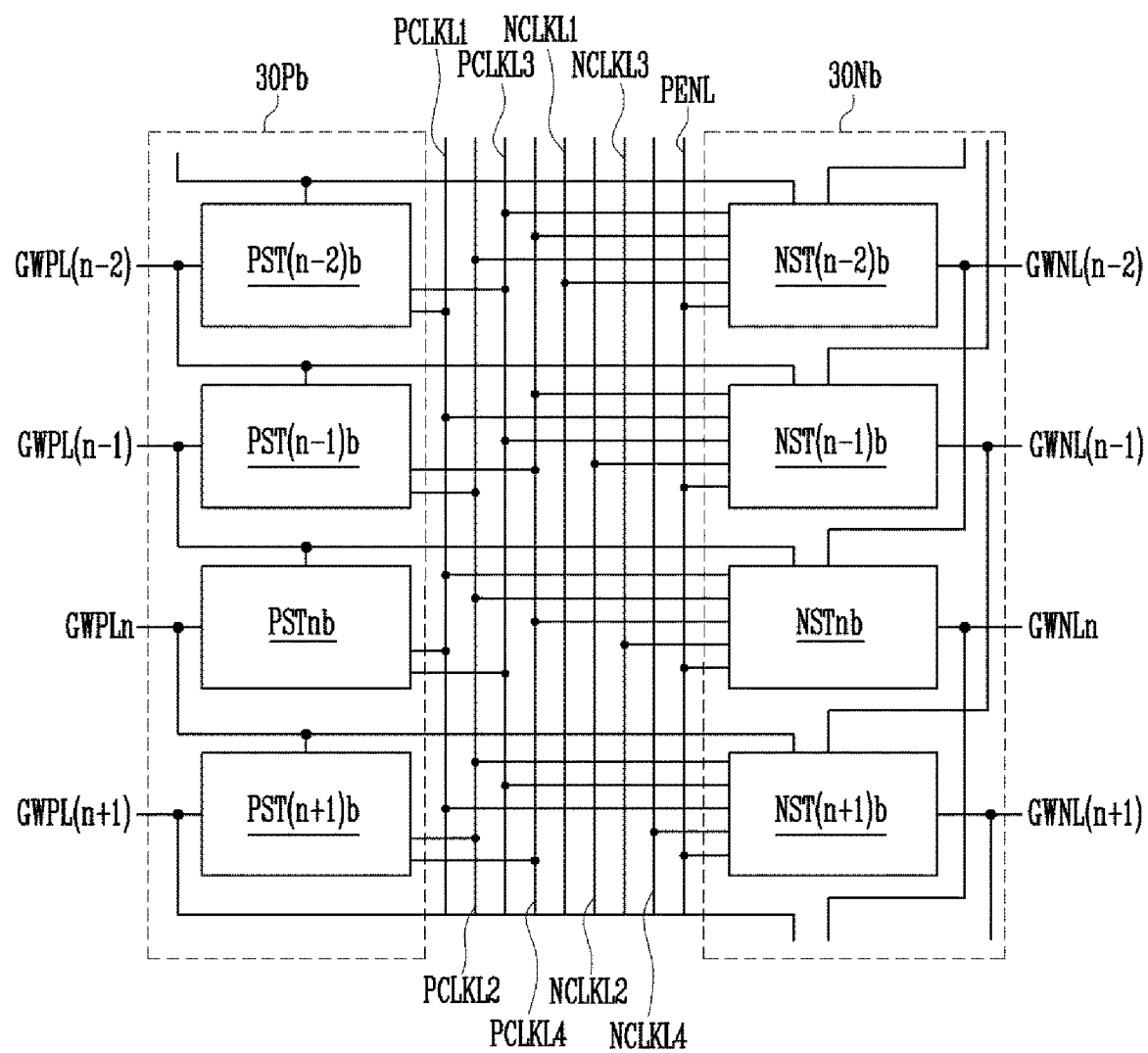
FIG. 5 is a diagram illustrating a scan driver according to some example embodiments of the present disclosure.

FIG. 5 is a diagram illustrating a scan driver according to some example embodiments of the present disclosure.

A scan driver 30Pb may correspond to the third sub-scan driver described with reference to FIG. 1. Although not shown in the drawing, those skilled in the art may implement the fourth sub-scan driver described with reference to FIG. 1 by replacing the scan lines . . . , GWPL(n−2), GWPL(n−1), GWPLn, GWPL(n+1), . . . , which are shown in FIG. 5, with the scan lines GBL1, GBLn, . . . .

The scan driver 30Pb may include scan stages . . . , PST(n−2)b, PST(n−1)b, PSTnb, PST(n+1)b, . . . . Each of the scan stages . . . , PST(n−2)b, PST(n+1)b, PSTnb, PST(n+1)b, . . . may be coupled to a corresponding one of clock lines PCLKL1, PCLKL2, PCLKL3, and PCLKL4 and a previous end scan line (or previous end scan line before last).

The scan stages . . . , PST(n−2)b, PST(n+1)b, PSTnb, PST(n+1)b, . . . may be coupled to each other in the form of a shift register. For example, scan signals may be generated in a manner that sequentially transfers a turn-on level pulse of a scan signal supplied from a previous scan line to a next scan stage.

Figure 7:
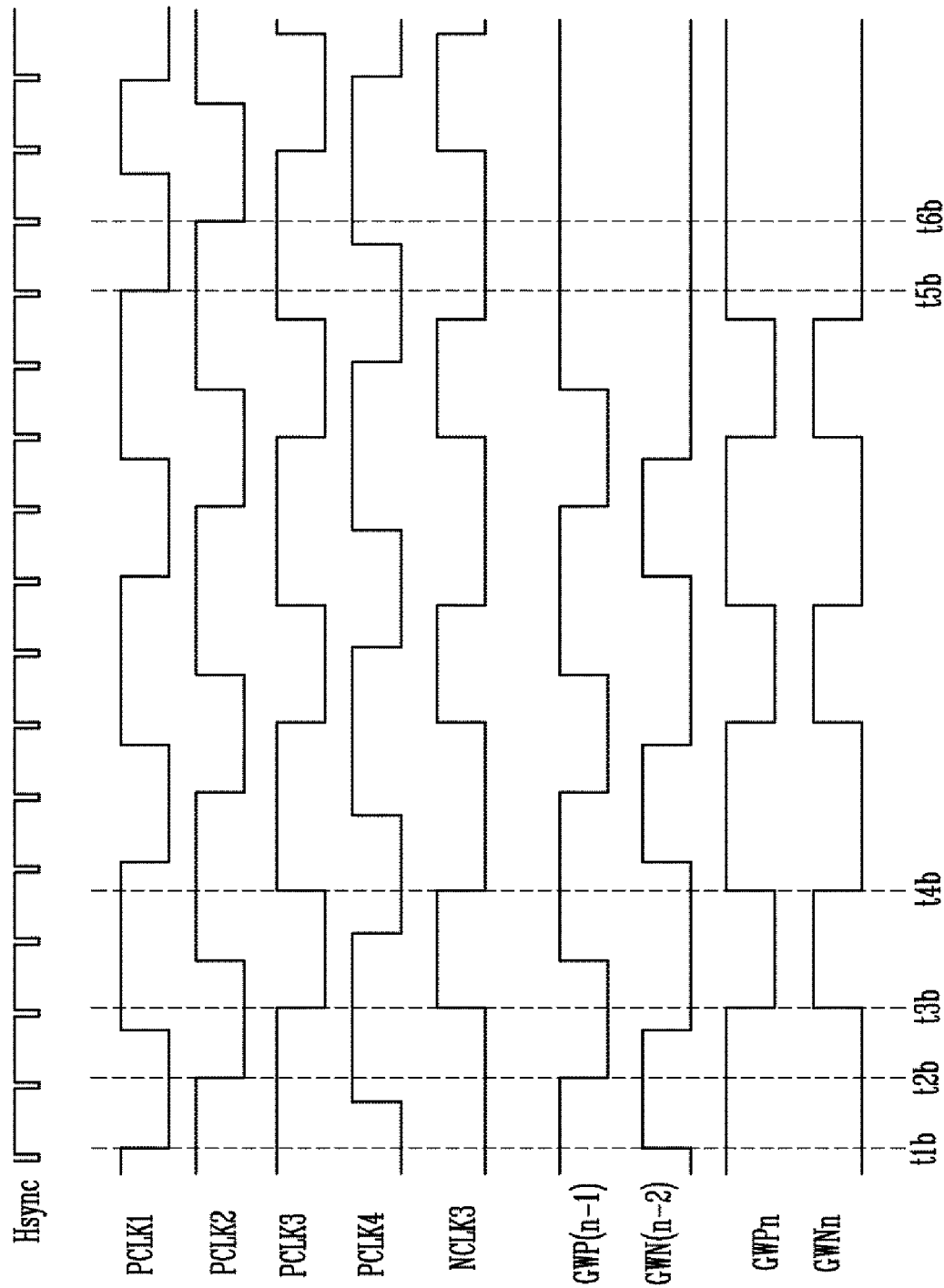
FIG. 7 is a diagram illustrating an example driving method of the scan stage shown in FIG. 6.

Referring in advance to FIG. 7, examples of clock signals PCLK1, PCLK2, PCLK3, and PCLK4 applied to the clock lines PCLKL1, PCLKL2, PCLKL3, and PCLKL4 and scan signals GWP(n+1) and GWPn applied to the scan lines GWPL(n+1) and GWPLn are illustrated. The clock signals PCLK1, PCLK2, PCLK3, and PCLK4 and the scan signals GWP(n+1) and GWPn may have pulses having a low level. As described above, the pulse having the low level may be expressed as a pulse having a second polarity or a falling pulse.

A scan driver 30Nb may correspond to the second sub-scan driver described with reference to FIG. 1. Although not shown in the drawing, those skilled in the art may implement the first sub-scan driver described with reference to FIG. 1 by replacing the scan lines . . . , GWNL(n−2), GWNL(n+1), GWNLn, GWNL(n+1), . . . , which are shown in FIG. 5, with the scan lines GIL1, GILn, . . . .

The scan driver 30Nb may include scan stages . . . , NST(n−2)b, NST(n+1)b, NSTnb, NST(n+1)b, . . . . Each of the scan stages . . . , NST(n−2)b, NST(n+1)b, NSTnb, NST(n+1)b, . . . may be coupled to corresponding ones of clock lines PCLKL1, PCLKL2, PCLKL3, PCLKL4, NCLKL1, NCLKL2, NCLKL3, and NCLKL4, a control line PENL, a previous end scan line before last, and the previous end scan line of the scan driver 30Pb. For example, the scan stage NSTnb may be coupled to the clock lines PCLKL1, PCLKL2, PCLKL4, and NCLKL3, the control line PENL, the previous end scan line GWNL(n−2) before last, and the previous end scan line GWPL(n+1) of the scan driver 30Pb. This embodiment illustrates an example coupling configuration for describing FIGS. 6 and 7, and another coupling configuration may be applied to scan stages shown in FIGS. 8 to 13. The scan stages . . . , NST(n−2)b, NST(n+1)b, NSTnb, NST(n+1)b, . . . may be coupled to each other in the form of a shift register.

A previous end scan signal applied to a previous end scan line may means a scan signal that has a minimum phase difference with a current scan signal applied to a current scan line while having a phase faster than that of the current scan signal. A previous end scan stage may mean a scan stage that uses the previous end scan line as an output line. A previous end scan signal before last applied to a previous end scan line before last may mean a scan signal that has a minimum phase difference with the previous end scan signal applied to the previous end scan line while having a phase faster than that of the previous end scan signal. A previous end scan stage before last may mean a scan stage that uses the previous end scan line before last as an output line. Hereinafter, for convenience of description, a scan signal may be expressed as a previous end scan signal or previous end scan signal before last, without considering the polarity of a pulse thereof. For example, scan signals applied to the scan lines GWP(n+1) and GWNL(n+1) may be previous end scan signals of a scan signal applied to the scan line GWNLn. Also, for example, scan signals applied to the scan lines GWPL(n−2) and GWNL(n−2) may be previous end scan signals before last of the scan signal applied to the scan line GWNLn, regardless of the polarity of pulses.

Referring in advance to FIG. 7, examples of a clock signal NCLK3 applied to the clock line NCLKL3 and scan signals GWN(n−2) and GWNn applied to the scan lines GWNL(n−2) and GWNLn are illustrated. The clock signal NCLK3 and the scan signals GWN(n−2) and GWNn may have pulses having a high level. As described above, the pulse having the high level may be expressed as a pulse having a first polarity or a rising pulse.

Although not shown in FIG. 7, clock signals applied to the clock lines NCLKL1, NCLKL2, and NCLKL4 may also have pulses having the high level. For example, the clock signal NCLK3 is an inversion signal of the clock signal PCLK3, and the clock signals applied to the clock lines NCLKL1, NCLKL2, and NCLKL4 may be inversion signals of the clock signals PCLK1, PCLK2, and PCLK4, respectively.

The clock signals applied to the clock lines PCLKL1, PCLKL2, PCLKL3, and PCLKL4 have the same period length (e.g., four horizontal periods), but may have different phases. For example, the clock signal PCLK2 applied to the clock line PCLKL2 may have a phase delayed by ¼ from that of the clock signal PCLK1 applied to the clock line PCLKL1. In addition, the clock signal PCLK3 applied to the clock line PCLKL3 may have a phase delayed by ¼ from that of the clock signal PCLK2 applied to the clock line PCLKL2. In addition, the clock signal PCLK4 applied to the clock line PCLKL4 may have a phase delayed by ¼ from that of the clock signal PCLK3 applied to the clock line PCLKL3.

Similarly, the clock signals applied to the clock lines NCLKL1, NCLKL2, NCLKL3, and NCLKL4 have the same period length (e.g., four horizontal periods), but may have different phases. For example, the clock signal NCLK2 applied to the clock line NCLKL2 may have a phase delayed by ¼ from that of the clock signal NCLK1 applied to the clock line NCLKL1. In addition, the clock signal NCLK3 applied to the clock line NCLKL3 may have a phase delayed by ¼ from that of the clock signal NCLK2 applied to the clock line NCLKL2. In addition, the clock signal NCLK4 applied to the clock line NCLKL4 may have a phase delayed by ¼ from that of the clock signal NCLK3 applied to the clock line NCLKL3.

Figure 6:
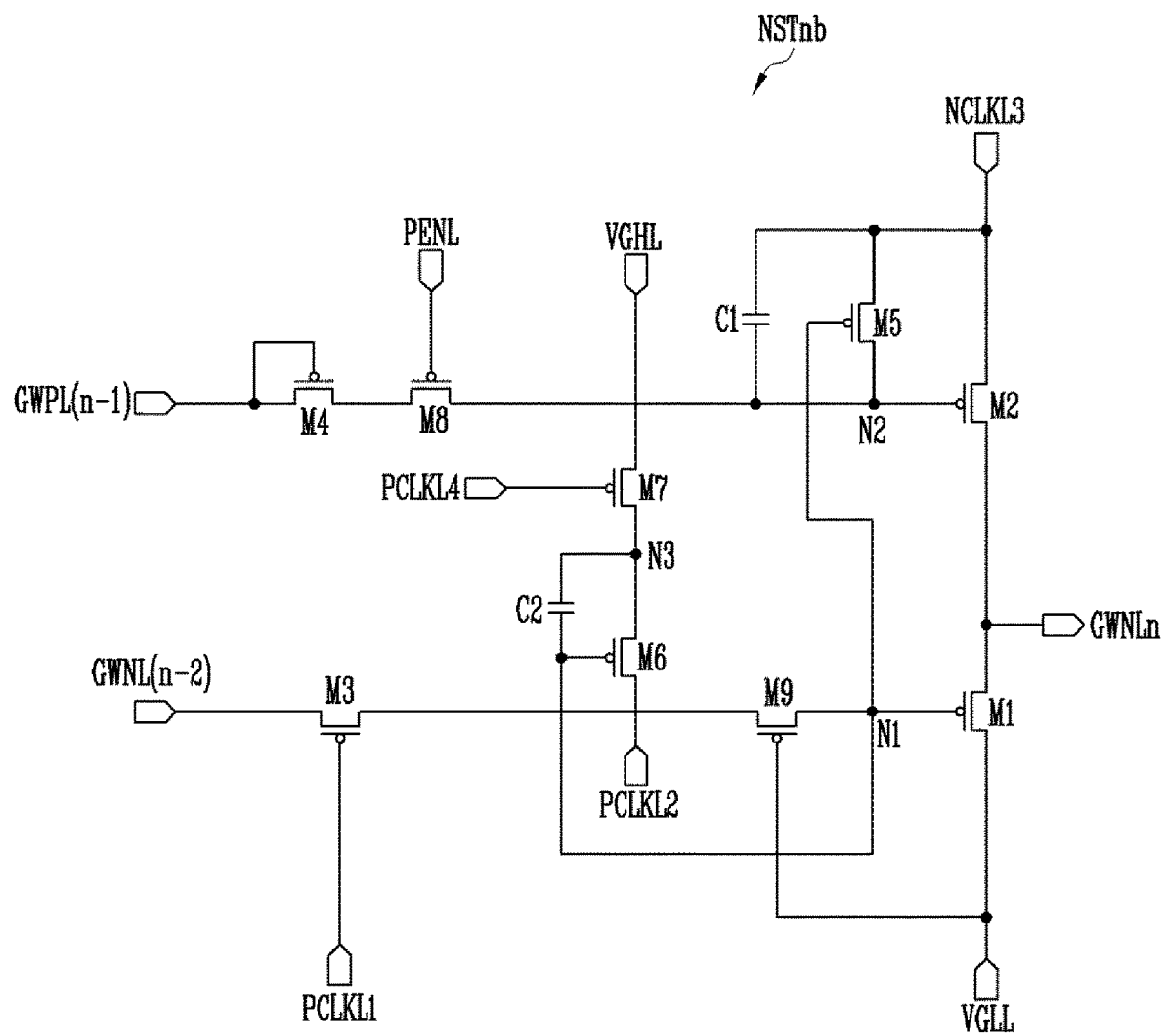
FIG. 6 is a diagram illustrating a scan stage of the scan driver shown in FIG. 5 according to some example embodiments of the present disclosure.

FIG. 6 is a diagram illustrating a scan stage of the scan driver shown in FIG. 5 according to some example embodiments of the present disclosure.

Referring to FIG. 6, an example of an nth scan stage NSTnb of the scan driver 30Nb shown in FIG. 5 is illustrated. The other scan stages . . . , NST(n−2)b, NST(n+1)b, NST(n+1)b, . . . , which are shown in FIG. 5, have the substantially same configuration as the scan stage NSTnb, and therefore, overlapping descriptions will be omitted.

The scan stage NSTnb may include transistors M1 to M9 and capacitors C1 and C2. The transistors M1 to M9 may be P-type transistors.

One electrode of the transistor M1 may be coupled to the scan line GWNLn, the other electrode of the first transistor M1 may be coupled to a power line VGLL, and a gate electrode of the transistor M1 may be coupled to a node N1.

One electrode of the transistor M2 may be coupled to the clock line NCLKL3, the other electrode of the transistor M2 may be coupled to the scan line GWNLn, and a gate electrode of the transistor M2 may be coupled to a node N2.

One electrode of the transistor M3 may be coupled to the node N1, the other electrode of the transistor M3 may be coupled to the scan line GWNL(n−2), and a gate electrode of the transistor M3 may be coupled to the clock line PCLKL1.

One electrode of the transistor M4 may be coupled to the node N2 through the transistor M8, and the other electrode and a gate electrode of the transistor M4 may be coupled to the scan line GWPL(n+1).

According to this embodiment, the scan line GWNL(n−2) and the scan line GWPL(n+1) may be different from each other. For example, the scan line GWNL(n−2) may be a scan line extending from the previous end scan stage NST(n−2)b before last of the scan driver 30Nb. In addition, the scan line GWPL(n+1) may be a scan line extending from the previous scan stage PST(n+1)b of the scan driver 30Pb. Therefore, pulses of the scan signal GWN(n−2) input to the scan line GWNL(n−2) may have a phase faster than that of pulses of the scan signal GWP(n+1) input to the scan line GWPL(n+1).

One electrode of the transistor M5 may be coupled to the clock line NCLKL3, the other electrode of the transistor M5 may be coupled to the node N2, and a gate electrode of the transistor M5 may be coupled to the node N1.

One electrode of the capacitor C1 may be coupled to the clock line NCLKL3, and the other electrode of the capacitor C1 may be coupled to the node N2.

One electrode of the capacitor C2 may be coupled to a node N3, and the other electrode of the capacitor C2 may be coupled to the node N1.

One electrode of the transistor M6 may be coupled to the node N3, the other electrode of the transistor M6 may be coupled to the clock line PCLKL2, and a gate electrode of the transistor M6 may be coupled to the node N1.

One electrode of the transistor M7 may be coupled to a power line VGHL, the other electrode of the transistor M7 may be coupled to the node N3, and a gate electrode of the transistor M7 may be coupled to the clock line PCLKL4.

One electrode of the transistor M8 may be coupled to the node N2, the other electrode of the transistor M8 may be coupled to the one electrode of the transistor M1, and a gate electrode of the transistor M8 may be coupled to the control line PENL.

One electrode of the transistor M9 may be coupled to the node N1, the other electrode of the transistor M9 may be coupled to the one electrode of the transistor M3, and a gate electrode of the transistor M9 may be coupled to the power line VGLL.

In the scan stage NSTnb shown in FIG. 6, four transistors and one capacitor CC3 are unnecessary, as compared with the scan stage NST1a shown in FIG. 3. Thus, the area necessary for each scan stage can be decreased. In addition, the scan stage NSTnb has no power consumption caused by charging/discharging of the capacitor CC3, and thus the power consumption of the scan stage NSTnb can be further improved than that of the scan stage NST1a.

FIG. 7 is a diagram illustrating an example driving method of the scan stage shown in FIG. 6.

Referring to FIG. 7, there is illustrated a timing diagram of clock signals PCLK1, PCLK2, PCLK3, PCLK4, and NCLK3 respectively applied to the clock lines PCLKL1, PCLKL2, PCLKL3, PCLKL4, and NCLKL3 and scan signals GWP(n+1), GWN(n−2), GWPn, and GWNn respectively applied to the scan lines GWPL(n+1), GWNL(n−2), GWPLn, and GWNLn. A horizontal synchronization signal Hsync is illustrated as a reference signal for timing. An interval between pulses of the horizontal synchronization signal Hsync may be referred to as one horizontal period.

Pulses of the clock signal NCLK3 may have a polarity opposite to that of pulses of the clock signal PCLK2, and the pulses of the clock signal NCLK3 and the pulses of the clock signal PCLK2 may overlap with each other for a partial time. The pulses of the clock signal NCLK3 may have a phase delayed from that of the pulses of the clock signal PCLK2.

Pulses of the clock signal PCLK4 may have a polarity opposite to that of pulses of the clock signal NCLK3, and the pulses of the clock signal PCLK4 and the pulses of the clock signal NCLK3 may overlap with each other for a partial time. The pulses of the clock signal PCLK4 may have a phase delayed from that of the pulses of the clock signal NCLK3.

A voltage having a high level may be applied to the power line VGHL, and a voltage having a low level may be applied to the power line VGLL. In the description of the driving method, the transistor M9 of which gate electrode is coupled to the power line VGLL is in a turn-on state during a majority of periods, and therefore, description of the transistor M9 will be omitted except a specific case.

Also, in the description of the driving method, a case where a control signal PEN has the low level is assumed. Hence, the transistor M8 maintains the turn-on state, and therefore, description of the transistor M8 will be omitted except a specific case.

First, at a time t1b, the clock signal PCLK1 having the low level and the scan signal GWN(n−2) having the high level are supplied.

The transistor M3 is turned on by the clock signal PCLK1 having the low level, and the scan signal GWN(n−2) having the high level is supplied to the node N1. Therefore, the transistors M1, M5, and M6 of which gate electrodes are coupled to the node N1 are turned off.

Because the transistor M4 is in a state in which it is diode-coupled, the direction of current is toward the other electrode that is a drain electrode of the transistor M4 from the one electrode that is a source electrode of the transistor M4. Therefore, at the time t1b, the scan signal GWP(n+1) having the high level is not transferred to the node N2. Accordingly, the node N2 maintains a voltage of a previous period.

At a time t2b, the scan signal GWP(n+1) having the low level and the clock signal PCLK2 having the low level are supplied.

Therefore, the voltage of the node N2 becomes the low level according to the scan signal GWP(n+1) having the low level, and the transistor M2 is turned on. Accordingly, the clock line NCLKL3 and the scan line GWNLn are coupled to each other, and the clock signal NCLK3 having the low level is output as the scan signal GWNn having the low level.

The voltage of the node N1 maintains the high level due to the scan signal GWN(n−2) having the high level and the clock signal PCLK1 having the low level, and therefore, the transistor M5 is in a turn-off state.

At a time t3b, the clock signal NCLK3 having the high level is supplied.

The transistor M2 maintains the turn-on state, and the transistor M5 maintains the turn-off state. Therefore, the clock signal NCLK3 having the high level is output as the scan signal GWNn having the high level.

According to an embodiment, pulses of the scan signal GWP(n+1) may overlap with some pulses of the clock signal NCLK3 for a partial time. Times at which the pulses of the scan signal GWP(n+1) are generated may be prior to those at which the some pulses of the clock signal NCLK3 are generated. That is, referring to FIG. 7, it can be seen that a first falling pulse of the scan signal GWP(n+1) is generated at the time t2b and a rising pulse of the clock signal NCLK3 is generated at the time t3b. If the scan signal GWP(n+1) having the low level is not in a state in which it is supplied to the node N2 when the clock signal NCLK3 rises to the high level at the time t3b, there is a risk that the voltage of the node N2 will rise due to coupling of the capacitor C1, which may cause the transistor M2 to be turned off. According to the embodiment, the turn-on state of the transistor M2 at the time t3b can be ensured.

At a time t4b, the clock signal NCLK3 having the low level is supplied.

The transistor M2 maintains the turn-on state, and the transistor M5 maintains the turn-off state. Therefore, the clock signal NCLK3 having the low level is output as the scan signal GWNn having the low level.

The voltage of the node N2 is lower than the low level due to the coupling of the capacitor C1. Thus, the transistor M2 stably maintains the turn-on state, and driving characteristics of the transistor M2 can be improved.

Although a voltage lower than the low level is applied to the one electrode of the transistor M8, the voltage of the other electrode of the transistor M8 is not lower than the low level. When a voltage lower than the low level is applied to the one electrode of the transistor M8 due to the coupling of the capacitor C1, the one electrode of the transistor M8 serves as a drain electrode. In addition, because a voltage having the low level is applied to the gate electrode of the transistor M8 through the control line PENL, a voltage higher than the low level is to be applied to a source electrode of the transistor M8 such that the transistor M8 is turned on. The voltage having the low level is applied to the source electrode of the transistor M8 at the current time, and therefore, the transistor M8 is in the turn-off state.

Thus, according to this embodiment, the voltage of the other electrode of the transistor M8 is maintained in spite of the coupling of the capacitor C1, so that a transient bias voltage is prevented from being applied to the transistor M4. Accordingly, the lifespan of the transistor M4 can be extended.

At a time t5b, the clock signal PCLK1 having the low level is supplied.

Because the scan signal GWN(n−2) having the low level is supplied to the scan line GWNL(n−2), the voltage of the node N1 becomes the low level. Therefore, the transistors M1, M5, and M6 of which gate electrodes are coupled to the node N1 are turned on.

When the transistor M1 is turned on, the power line VGLL and the scan line GWNLn are coupled to each other. Therefore, a power voltage having the low level is output as the scan signal GWNn having the low level.

When the transistor M5 is turned on, the transistor M2 is diode-coupled. Therefore, although the clock signal NCLK3 having the high level is then supplied, a voltage having the high level is not transferred to the scan line GWNn.

When the transistor M6 is turned on, the clock line PCLKL2 and the node N3 are coupled to each other. Therefore, the clock signal PCLK2 having the high level is applied to the one electrode of the capacitor C2.

At a time t6b, the clock signal PCLK2 having the low level is supplied.

Because the transistor M6 is in the turn-on state, the one electrode of the capacitor C2 and the clock line PCLKL2 are coupled to each other, and the voltage of the node N1 is lower than the low level due to coupling of the capacitor C2. Thus, the transistor M1 stably maintains the turn-on state, and driving characteristics of the transistor M1 can be improved.

Although a voltage lower than the low level is applied to the node N1 corresponding to the one electrode of the transistor M9, the voltage of the other electrode of the transistor M9 is not lower than the low level. When a voltage lower than the low level is applied to the one electrode of the transistor M9 due to the coupling of the capacitor C2, the one electrode of the transistor M9 serves as a drain electrode. Therefore, the other electrode of the transistor M9 serves as a source electrode. In addition, because a voltage having the low level is applied to the gate electrode of the transistor M9 through the power line VGLL, a voltage higher than the low level is to be applied to the source electrode of the transistor M9 such that the transistor M9 is turned on. The voltage having the low level is applied to the source electrode of the transistor M9 at the current time, and therefore, the transistor M9 is in the turn-off state.

Thus, according to some example embodiments, the voltage of the other electrode of the transistor M9 is maintained in spite of the coupling of the capacitor C2, so that a transient bias voltage is prevented from being applied to the transistor M3. Accordingly, the lifespan of the transistor M3 can be extended.

In this embodiment, a case where the number of pulse of each scan signal is three is illustrated. This is a driving method for applying, multiple times, an on-bias voltage to a driving transistor of each pixel. In another embodiment, when the number of pulses of the scan start signal is one as shown in FIG. 4, the number of pulses of each scan signal may be one.

FIGS. 8 to 11 are diagrams illustrating modifications of the scan stage shown in FIG. 6.

Figure 8:
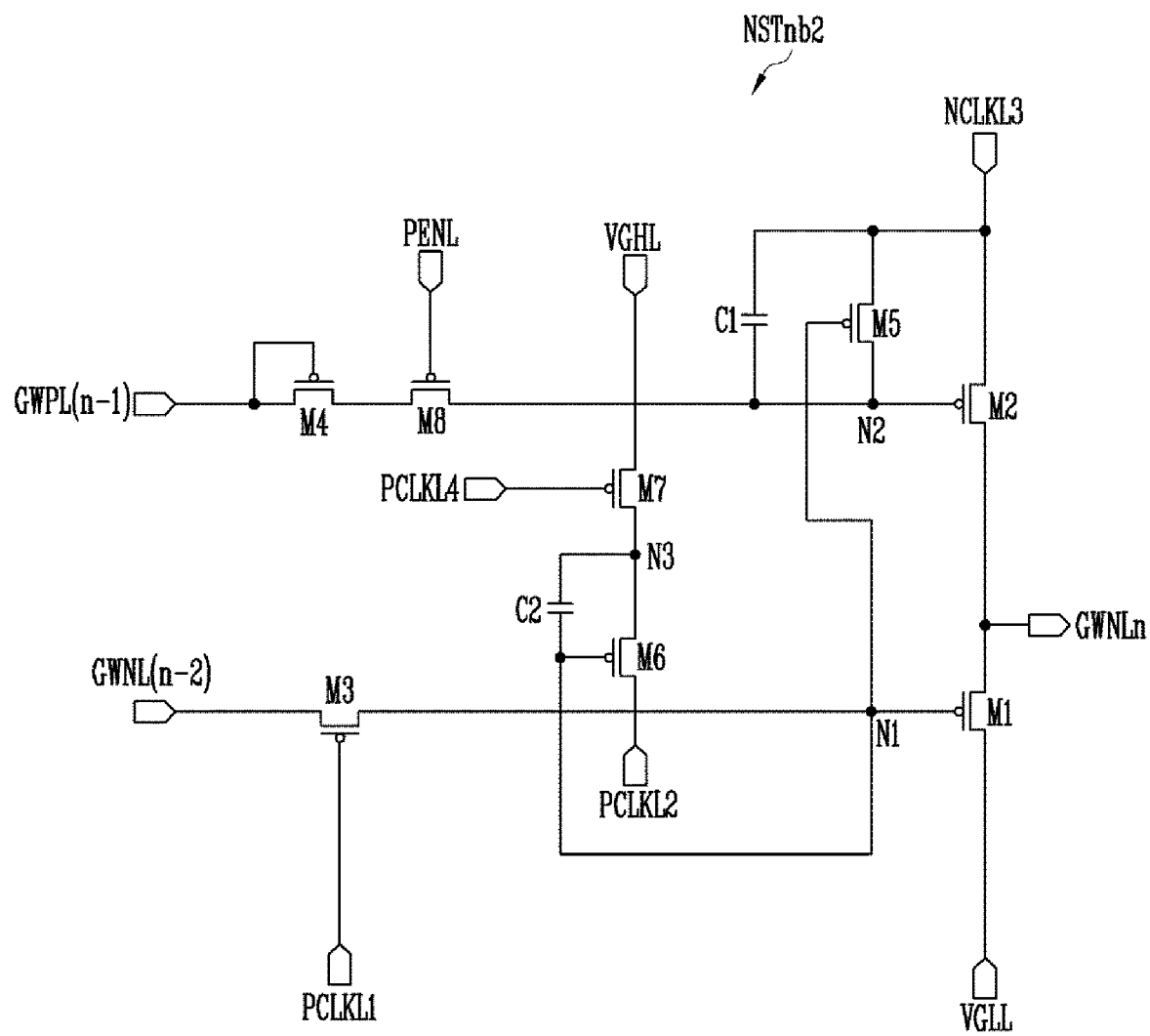
FIGS. 8 to 11 are diagrams illustrating modifications of the scan stage shown in FIG. 6.

A scan stage NSTnb2 shown in FIG. 8 does not include the transistor M9, as compared with the scan stage NSTnb shown in FIG. 6. Therefore, the scan stage NSTnb2 shown in FIG. 8 has a characteristic in that the area necessary for each scan stage can be decreased, as compared with the scan stage NSTnb shown in FIG. 6. The driving method shown in FIG. 7 may be substantially identically applied to a driving method of the scan stage NSTnb2 shown in FIG. 8, and therefore, overlapping descriptions will be omitted.

Figure 9:
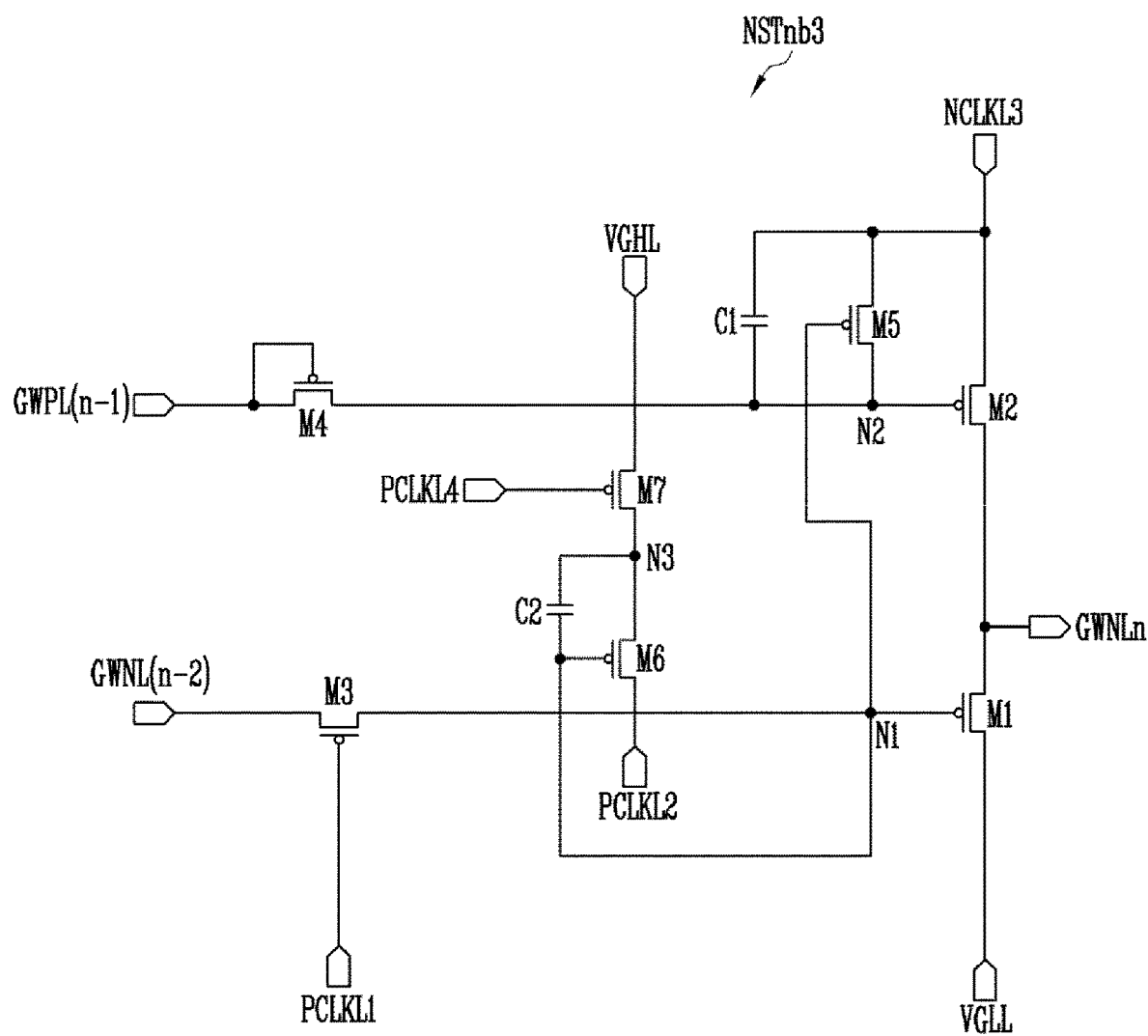

A scan stage NSTnb3 shown in FIG. 9 does not include the transistors M8 and M9, as compared with the scan stage NSTnb shown in FIG. 6. Therefore, the scan stage NSTnb3 shown in FIG. 9 has a characteristic in that the area necessary for each scan stage can be decreased, as compared with the scan stage NSTnb shown in FIG. 6. The driving method shown in FIG. 7 may be substantially identically applied to a driving method of the scan stage NSTnb3 shown in FIG. 9, and therefore, overlapping descriptions will be omitted.

Figure 10:
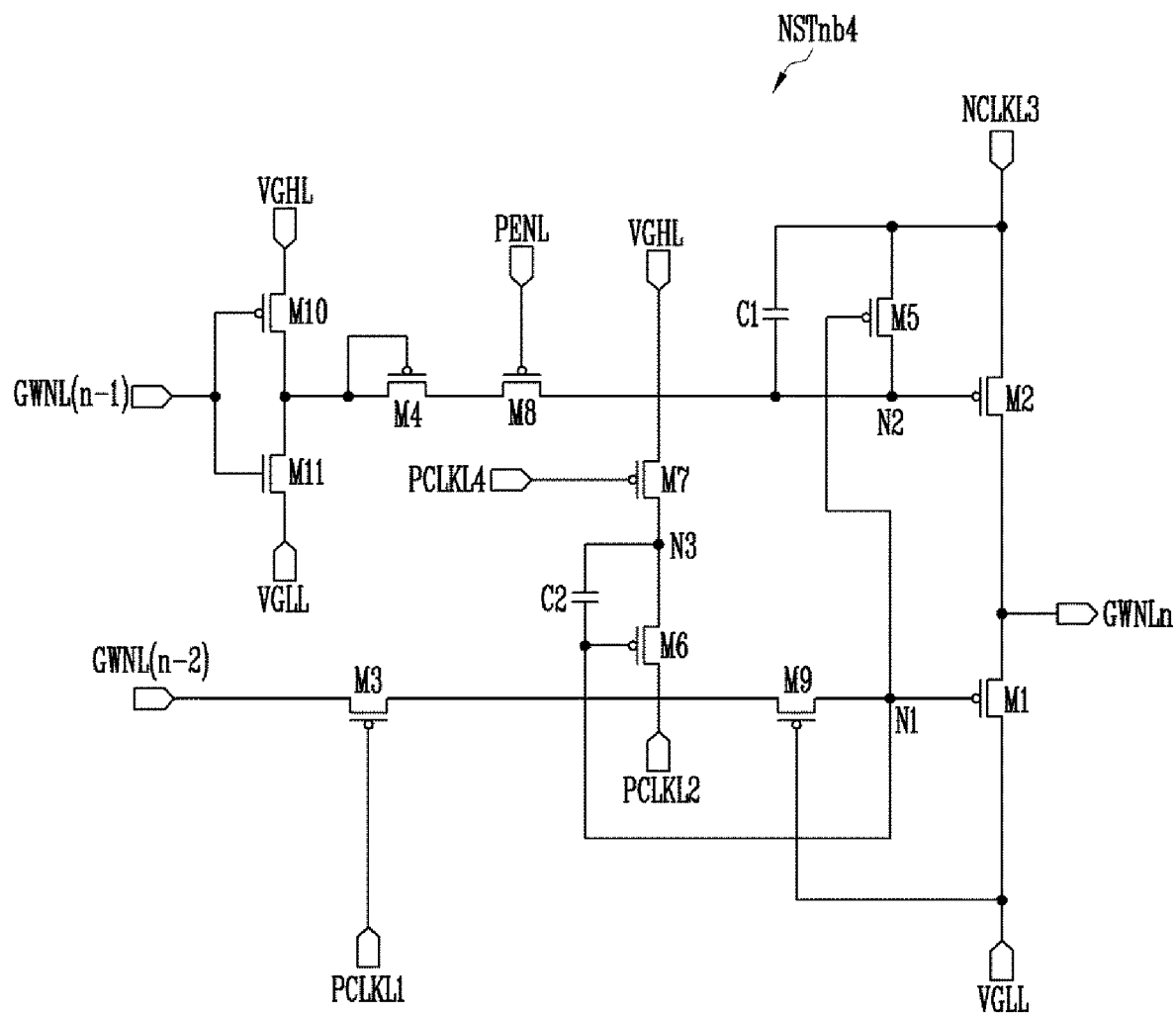

A scan stage NSTnb4 shown in FIG. 10 further includes transistors M10 and M11, as compared with the scan stage NSTnb shown in FIG. 6, and the scan line GWPL(n+1) is replaced with the scan line GWNL(n+1).

One electrode of the transistor M10 may be coupled to the power line VGHL, the other electrode of the transistor M10 may be coupled to the other electrode of the transistor M4, and a gate electrode of the transistor M10 may be coupled to the scan line GWNL(n+1). The transistor M10 may be a P-type transistor.

One electrode of the transistor M11 may be coupled to the other electrode of the transistor M4, the other electrode of the transistor M11 may be coupled to the power line VGLL, and a gate electrode of the transistor M11 may be coupled to the scan line GWNL(n+1). The transistor 11 may be an N-type transistor.

According to some example embodiments shown in FIG. 10, the number of transistors included in each scan stage increases, but it is unnecessary to draw the scan line GWPL(n+1) by extending the scan line GWPL(n+1) from the scan driver 30Pb, and thus line complexity can be reduced.

The driving method shown in FIG. 7 may be substantially identically applied to a driving method of the scan stage NSTnb4 shown in FIG. 10, except that a scan signal having a polarity opposite to that of the scan signal GWP(n+1), and therefore, overlapping descriptions will be omitted.

Figure 11:
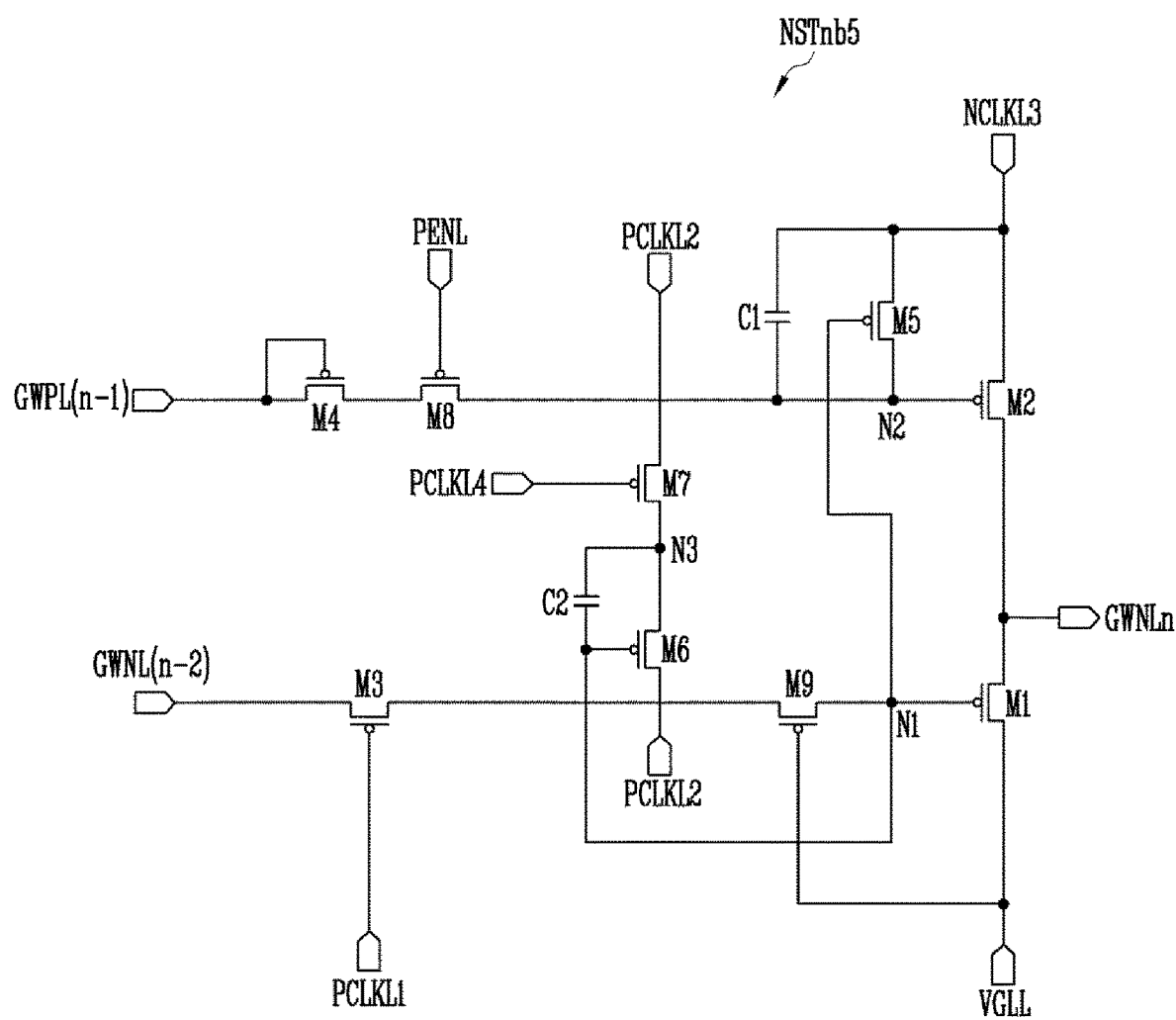

In a scan stage NSTnb5 shown in FIG. 11, the clock line PCLKL2 instead of the power line VGHL is coupled to the one electrode of the transistor M7, as compared with the scan stage NSTnb. Referring to FIG. 7, while the clock signal PCLK4 having the low level is being applied such that the transistor M7 is turned on, the clock signal PCLK2 having the high level is always supplied to the one electrode of the transistor M7. Therefore, with respect to only the transistor M7, the clock signal PCLK2 may operate as if the power voltage having the high level.

According to some example embodiments shown in FIG. 11, it is unnecessary to couple the power line VGHL to each scan stage, and thus line complexity can be reduced. Accordingly, the area necessary for each scan stage can be decreased. The driving method shown in FIG. 7 may be substantially identically applied to a driving method of the scan stage NSTnb5 shown in FIG. 11, and therefore, overlapping descriptions will be omitted.

Figure 12:
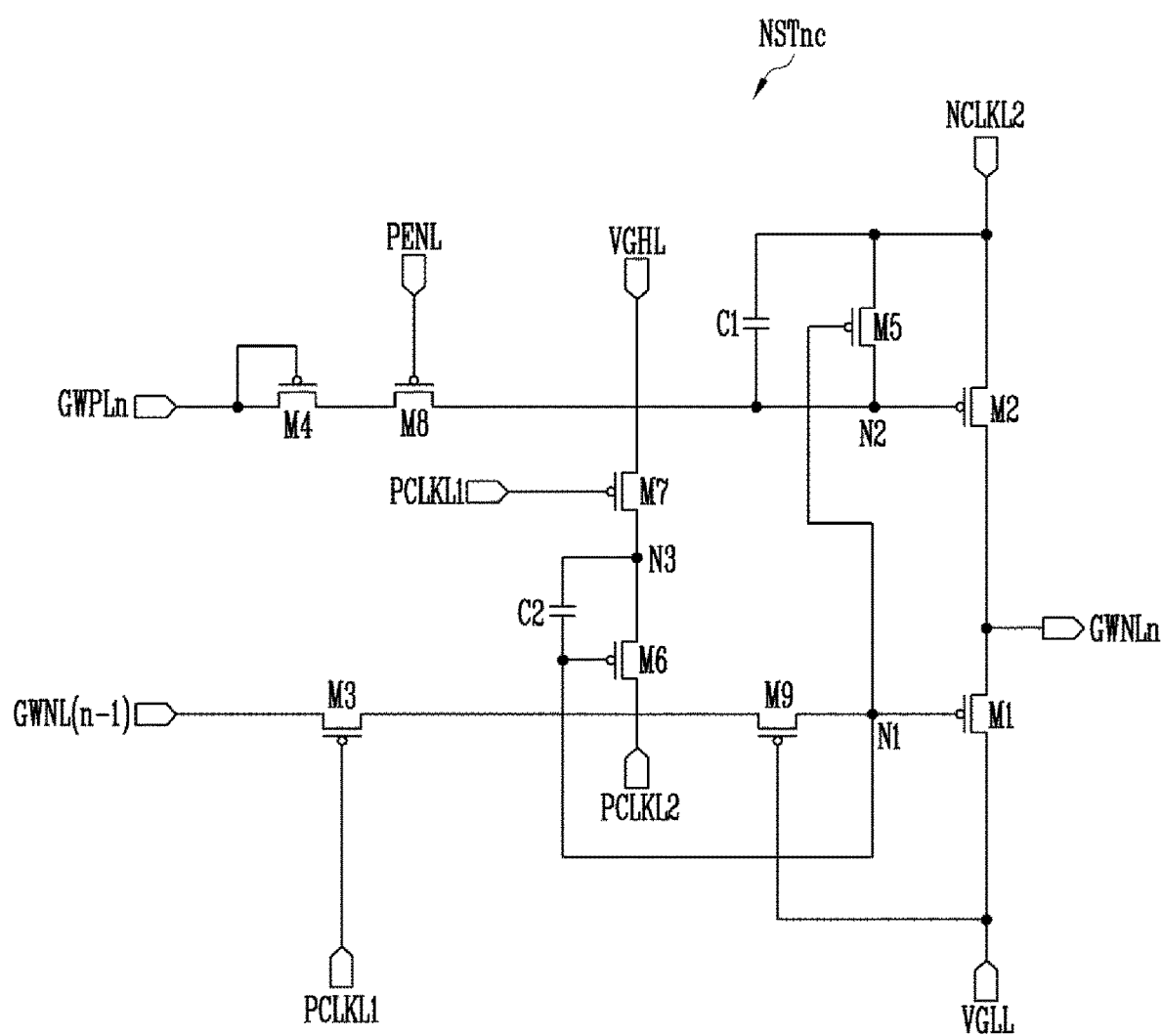
FIG. 12 is a diagram illustrating a scan stage of the scan driver according to some example embodiments of the present disclosure.

FIG. 12 is a diagram illustrating a scan stage of the scan driver according to some example embodiments of the present disclosure.

Referring to FIG. 12, the scan stage NSTnc may include transistors M1 to M9 and capacitors C1 and C2. The transistors M1 to M9 may be P-type transistors.

A relative position relationship of the transistors M1 to M9 and the capacitors C1 and C2, which are shown in FIG. 12, is substantially identical to that of the scan stage NSTnb shown in FIG. 6, but clock lines and scan lines, which are coupled to the scan stage NSTnc, are different from those of the scan stage NSTnb. A driving method changed due to the difference will be described later with reference to FIG. 13. The driving method shown in FIG. 7 may be expressed as an overlapping driving method. On the other hand, the driving method shown in FIG. 13 may be expressed as a non-overlapping driving method.

One electrode of the transistor M1 may be coupled to the scan line GWNLn, the other electrode of the transistor M1 may be coupled to a power line VGLL, and a gate electrode of the transistor M1 may be coupled to a node N1.

One electrode of the transistor M2 may be coupled to the clock line NCLKL2, the other electrode of the transistor M2 may be coupled to the scan line GWNLn, and a gate electrode of the transistor M2 may be coupled to a node N2.

One electrode of the transistor M3 may be coupled to the node N1, the other electrode of the transistor M3 may be coupled to the scan line GWNL(n+1), and a gate electrode of the transistor M3 may be coupled to the clock line PCLKL1.

One electrode of the transistor M4 may be coupled to the node N2, and the other electrode and a gate electrode of the transistor M4 may be coupled to the scan line GWPLn.

According to some example embodiments, the scan line GWNL(n+1) and the scan line GWPLn may be different from each other. Pulses of a scan signal GWN(n+1) input to the scan line GWNL(n+1) may have a phase faster than that of pulses of a scan signal GWPn input to the scan line GWPLn.

One electrode of the transistor M5 may be coupled to the clock line NCLKL2, the other electrode of the transistor M5 may be coupled to the node N2, and a gate electrode of the transistor M5 may be coupled to the node N1.

One electrode of the capacitor C1 may be coupled to the clock line NCLKL2, and the other electrode of the capacitor C1 may be coupled to the node N2.

One electrode of the capacitor C2 may be coupled to a node N3, and the other electrode of the capacitor C2 may be coupled to the node N1.

One electrode of the transistor M6 may be coupled to the node N3, the other electrode of the transistor M6 may be coupled to the clock line PCLKL2, and a gate electrode of the transistor M6 may be coupled to the node N1.

One electrode of the transistor M7 may be coupled to a power line VGHL, the other electrode of the transistor M7 may be coupled to the node N3, and a gate electrode of the transistor M7 may be coupled to the clock line PCLKL1.

One electrode of the transistor M8 may be coupled to the node N2, the other electrode of the transistor M8 may be coupled to the one electrode of the transistor M4, and a gate electrode of the transistor M8 may be coupled to the control line PENL.

One electrode of the transistor M9 may be coupled to the node N1, the other electrode of the transistor M9 may be coupled to the one electrode of the transistor M3, and a gate electrode of the transistor M9 may be coupled to the power line VGLL.

In the scan stage NSTnc shown in FIG. 12, four transistors and one capacitor CC3 are unnecessary, as compared with the scan stage NST1a shown in FIG. 3. Thus, the area necessary for each scan stage can be decreased. In addition, the scan stage NSTnc has no power consumption caused by charging/discharging of the capacitor CC3, and thus the power consumption of the scan stage NSTnb can be further improved than that of the scan stage NST1a.

Figure 13:
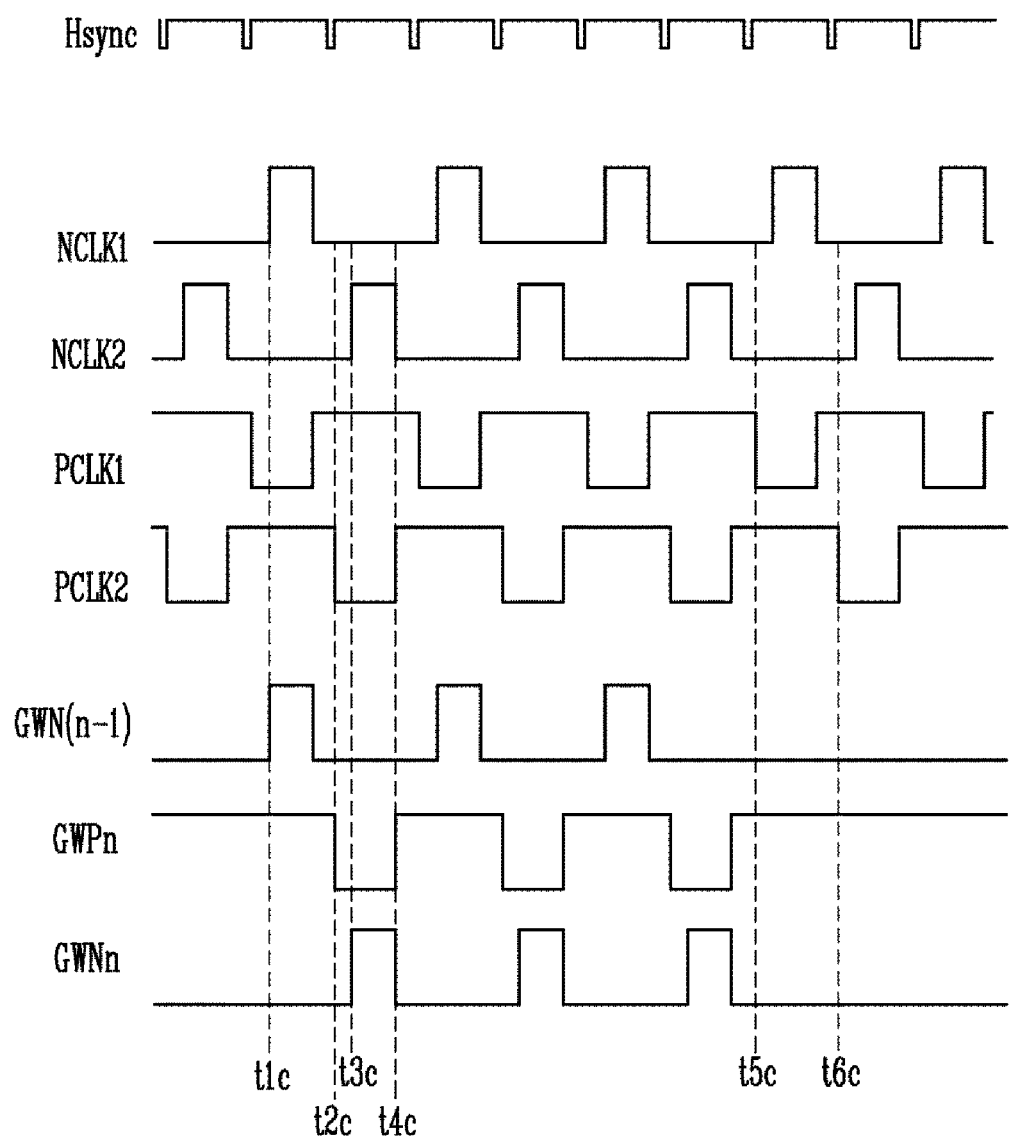
FIG. 13 is a diagram illustrating an example driving method of the scan stage shown in FIG. 12.

FIG. 13 is a diagram illustrating an example driving method of the scan stage shown in FIG. 12.

Referring to FIG. 13, there is illustrated a timing diagram of clock signals NCLK1, NCLK2, PCLK1, and PCLK2 respectively applied to the clock lines NCLKL1, NCLKL2, PCLKL1, and PCLKL2 and scan signals GWN(n+1), GWPn, and GWNn respectively applied to the scan lines GWNL(n+1), GWPLn, and GWNLn. A horizontal synchronization signal Hsync is illustrated as a reference signal for timing. An interval between pulses of the horizontal synchronization signal Hsync may be referred to as one horizontal period.

Pulses of the clock signal NCLK2 may have a polarity opposite to that of pulses of the clock signal PCLK2, and the pulses of the clock signal NCLK2 may be generated for times at which the pulses of the clock signal PCLK2 are generated. Times at which the pulses of the clock signal NCLK2 are generated may be delayed from those at which the pulses of the clock signal PCLK2 are generated.

Pulses of the clock signal PCLK1 may have a polarity opposite to that of the pulses of the clock signal NCLK2. The pulses of the clock signal PCLK1 may not temporally overlap with the pulses of the clock signal NCLK2.

A voltage having a high level may be applied to the power line VGHL, and a voltage having a low level may be applied to the power line VGLL. In the description of the driving method, the transistor M9 of which gate electrode is coupled to the power line VGLL is in a turn-on state during a majority of periods, and therefore, description of the transistor M9 will be omitted except a specific case.

Also, in the description of the driving method, a case where a control signal PEN has the low level is assumed. Hence, the transistor M8 maintains the turn-on state, and therefore, description of the transistor M8 will be omitted except a specific case.

First, at a time t1c, the scan signal GWN(n+1) having the high level is supplied.

Because the transistor M3 is in a state in which it is turned on by the clock signal PCLK1 having the low level, the scan signal GWN(n+1) having the high level is supplied to the node N1. Therefore, the transistors M1, M5, and M6 of which gate electrodes are coupled to the node N1 are turned off.

Because the transistor M4 is in a state in which it is diode-coupled, the direction of current is toward the other electrode that is a drain electrode of the transistor M4 from the one electrode that is a source electrode of the transistor M4. Therefore, at the time t1c, the scan signal GWPn having the high level is not transferred to the node N2. Accordingly, the node N2 maintains a voltage of a previous period.

At a time t2c, the scan signal GWPn having the low level and the clock signal PCLK2 having the low level are supplied.

Therefore, the voltage of the node N2 becomes the low level according to the scan signal GWPn having the low level, and the transistor M2 is turned on. Accordingly, the clock line NCLKL2 and the scan line GWNLn are coupled to each other, and the clock signal NCLK2 having the low level is output as the scan signal GWNn having the low level.

Although the scan signal GWN(n+1) having the low level is supplied, the transistor M3 is in a turn-off state due to the clock signal PCLK1 having the high level. Therefore, the voltage of the first node N1 maintains the high level, and accordingly, the transistor M5 is in the turn-off state.

At a time t3c, the clock signal NCLK2 having the high level is supplied.

The transistor M2 maintains the turn-on state, and the transistor M5 maintains the turn-off state. Therefore, the clock signal NCLK2 having the high level is output as the scan signal GWNn having the high level.

According to some example embodiments, pulses of the scan signal GWPn may overlap with some pulses of the clock signal NCLK2 for a partial time. Times at which the pulses of the scan signal GWPn are generated may be prior to those at which the some pulses of the clock signal NCLK2 are generated. That is, referring to FIG. 13, it can be seen that a first falling pulse of the scan signal GWPn is generated at the time t2c and a rising pulse of the clock signal NCLK2 is generated at the time t3c. That is, if the scan signal GWPn having the low level is not in a state in which it is supplied to the node N2 when the clock signal NCLK2 rises to the high level at the time t3c, there is a risk that the voltage of the node N2 will rise due to coupling of the capacitor C1. The transistor M2 may be turned off. Thus, according to some example embodiments, the turn-on state of the transistor M2 at the time t3c can be ensured.

At a time t4c, the clock signal NCLK2 having the low level is supplied.

The transistor M2 maintains the turn-on state, and the transistor M5 maintains the turn-off state. Therefore, the clock signal NCLK2 having the low level is output as the scan signal GWNn having the low level.

The voltage of the node N2 is lower than the low level due to the coupling of the capacitor C1. Thus, the transistor M2 stably maintains the turn-on state, and driving characteristics of the transistor M2 can be improved.

Although a voltage lower than the low level is applied to the one electrode of the transistor M8, the voltage of the other electrode of the transistor M8 is not lower than the low level. When a voltage lower than the low level is applied to the one electrode of the transistor M8 due to the coupling of the capacitor C1, the one electrode of the transistor M8 serves as a drain electrode. In addition, because a voltage having the low level is applied to the gate electrode of the transistor M8 through the control line PENL, a voltage higher than the low level is to be applied to a source electrode of the transistor M8 such that the transistor M8 is turned on. Therefore, the transistor M8 is turned off before the voltage of the source electrode of the transistor M8 is lower than the low level.

Thus, according to some example embodiments, the voltage of the other electrode of the transistor M8 is maintained in spite of the coupling of the capacitor C1, so that incidences of a transient bias voltage being applied to the transistor M4 may be prevented or reduced. Accordingly, the lifespan of the transistor M4 may be extended.

At a time t5c, the clock signal PCLK1 having the low level is supplied.

Because the scan signal GWN(n+1) having the low level is supplied to the scan line GWNL(n+1), the voltage of the node N1 becomes the low level. Therefore, the transistors M1, M5, and M6 of which gate electrodes are coupled to the node N1 are turned on.

When the transistor M1 is turned on, the power line VGLL and the scan line GWNLn are coupled to each other. Therefore, a power voltage having the low level is output as the scan signal GWNn having the low level.

When the transistor M5 is turned on, the transistor M2 is diode-coupled. Therefore, although the clock signal NCLK2 having the high level is then supplied, a voltage having the high level is not transferred to the scan line GWNn.

When the transistor M6 is turned on, the clock line PCLKL2 and the node N3 are coupled to each other. Therefore, the clock signal PCLK2 having the high level is applied to the one electrode of the capacitor C2.

At a time t6c, the clock signal PCLK2 having the low level is supplied.

Because the transistor M6 is in the turn-on state, the one electrode of the capacitor C2 and the clock line PCLKL2 are coupled to each other, and the voltage of the node N1 is lower than the low level due to coupling of the capacitor C2. Thus, the transistor M1 stably maintains the turn-on state, and driving characteristics of the transistor M1 can be improved.

Although a voltage lower than the low level is applied to the node N1 corresponding to the one electrode of the transistor M9, the voltage of the other electrode of the transistor M9 is not lower than the low level. When a voltage lower than the low level is applied to the one electrode of the transistor M9 due to the coupling of the capacitor C2, the one electrode of the transistor M9 serves as a drain electrode. Therefore, the other electrode of the transistor M9 serves as a source electrode. In addition, because a voltage having the low level is applied to the gate electrode of the transistor M9 through the power line VGLL, a voltage higher than the low level is to be applied to the source electrode of the transistor M9 such that the transistor M9 is turned on. The voltage having the low level is applied to the source electrode of the transistor M9 at the current time, and therefore, the transistor M9 is in the turn-off state.

Thus, according to some example embodiments, the voltage of the other electrode of the transistor M9 is maintained in spite of the coupling of the capacitor C2, so that a transient bias voltage is prevented from being applied to the transistor M3. Accordingly, the lifespan of the transistor M3 can be extended.

In this embodiment, a case where the number of pulse of each scan signal is three is illustrated. This is a driving method for applying, multiple times, an on-bias voltage to a driving transistor of each pixel. In another embodiment, when the number of pulses of the scan start signal is one as shown in FIG. 4, the number of pulses of each scan signal may be one.

Figure 14:
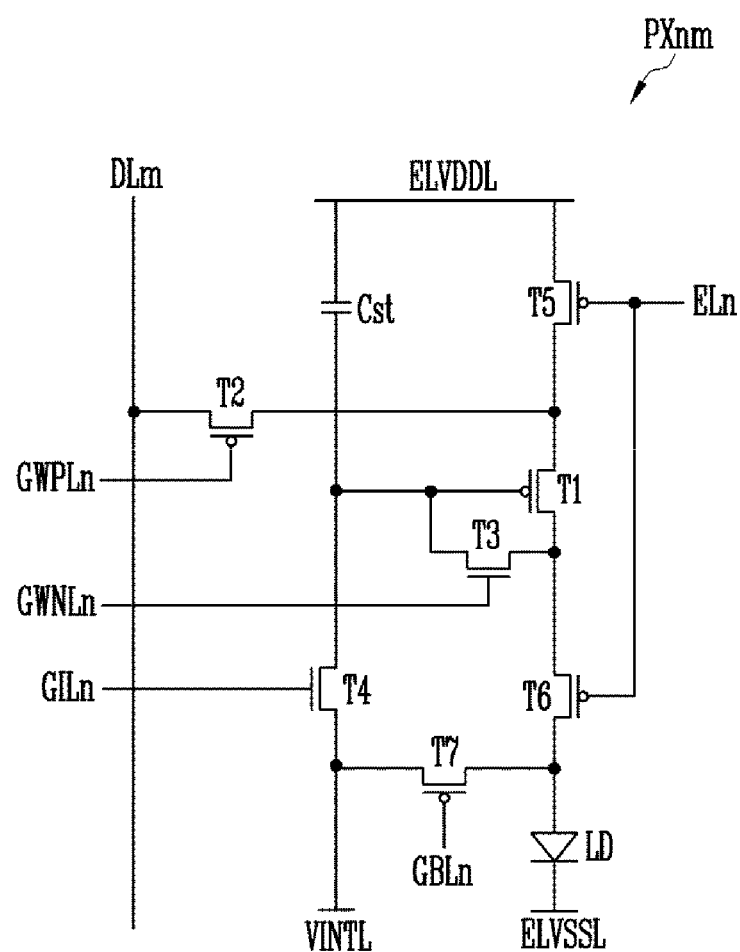
FIG. 14 is a diagram illustrating a pixel according to some example embodiments of the present disclosure.

FIG. 14 is a diagram illustrating a pixel according to some example embodiments of the present disclosure.

Referring to FIG. 14, the pixel PXnm according to some example embodiments of the present disclosure includes transistors T1 to T7, a storage capacitor Cst, and a light emitting diode LD.

One electrode of the transistor T1 may be coupled to one electrode of the transistor T2, the other electrode of the transistor T1 may be coupled to one electrode of the transistor T3, and a gate electrode of the transistor T1 may be coupled to the other electrode of the transistor T3. The transistor T1 may be referred to as a driving transistor.

The one electrode of the transistor T2 may be coupled to the one electrode of the transistor T1, the other electrode of the transistor T2 may be coupled to a data line DLm, and a gate electrode of the transistor T2 may be coupled to a scan line GWPLn. The transistor T2 may be referred to as a switching transistor, a scan transistor or the like.

The one electrode of the transistor T3 may be coupled to the other electrode of the transistor T1, the other electrode of the transistor T3 may be coupled to the gate electrode of the transistor T1, and a gate electrode of the transistor T3 may be coupled to the scan line GWNLn. The transistor T3 may be referred to as a diode-coupled transistor.

One electrode of the transistor T4 may be coupled to the other electrode of the capacitor Cst, the other electrode of the transistor T4 may be coupled to an initialization line VINTL, and a gate electrode of the transistor T4 may be coupled to a scan line GILn. The transistor T4 may be referred to as a gate initialization transistor.

One electrode of the transistor T5 may be coupled to a power line ELVDDL, the other electrode of the transistor T5 may be coupled to the one electrode of the transistor T1, and a gate electrode of the transistor T5 may be coupled to an emission line ELn. The transistor T5 may be referred to as a first light emitting transistor.

One electrode of the transistor T6 may be coupled to the other electrode of the transistor T1, the other electrode of the transistor T6 may be coupled to an anode of the light emitting diode LD, and a gate electrode of the transistor T6 may be coupled to the emission line ELn. The transistor T6 may be referred to as a second light emitting transistor.

One electrode of the transistor T7 may be coupled to the anode of the light emitting diode LD, the other electrode of the transistor T7 may be coupled to the initialization line VINTL, and a gate electrode of the transistor T7 may be coupled to a scan line GBLn. The transistor T7 may be referred to as an anode initialization transistor.

One electrode of the storage capacitor Cst may be coupled to the power line ELVDDL, and the other electrode of the storage capacitor Cst may be coupled to the gate electrode of the transistor T1.

The anode of the light emitting diode LD may be coupled to the other electrode of the transistor T6, and a cathode of the light emitting diode LD may be coupled to a power line ELVSSL. A voltage applied to the power line ELVSSL may be set lower than that applied to the power line ELVDDL. The light emitting diode LD may be an organic light emitting diode, a nano light emitting diode or the like.

The transistors T1, T2, T5, T6, and T7 may be P-type transistors. Channels of the transistors T1, T2, T5, T6, and T7 may be configured with poly silicon. A poly silicon transistor may be a Low Temperature Poly Silicon (LTPS) transistor. The poly silicon transistor has high electron mobility and accordingly has a fast driving property.

The transistors T3 and T4 may be N-type transistors. Channels of the transistors T3 and T4 may be configured with an oxide semiconductor. An oxide semiconductor transistor may be formed through a low temperature process, and has a charge mobility lower than that of the poly silicon transistor. Therefore, oxide semiconductor transistors have a small amount of leakage current generated in a turn-off state, as compared with poly silicon transistors.

In some embodiments, the transistor T7 may be configured as an N-type oxide semiconductor transistor, instead of the poly silicon transistor. One of the scan lines GWNLn and GILn may be coupled to the gate electrode of the transistor T7, in substitute for the scan line GBLn.

Figure 15:
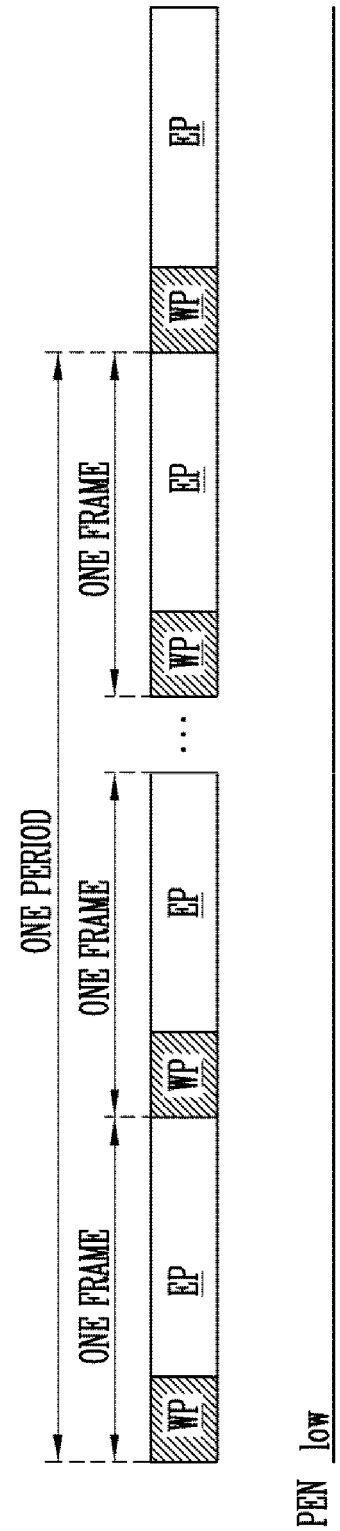
FIG. 15 is a diagram illustrating a high-frequency driving method according to some example embodiments of the present disclosure.

FIG. 15 is a diagram illustrating a high-frequency driving method according to some example embodiments of the present disclosure.

When the display device 9 is driven using a high-frequency driving method, it may be expressed that the display device 9 is in a first driving mode. Also, when the display device 9 is driven using a low-frequency driving method, it may be expressed that the display device 9 is in a second driving mode.

The first driving mode may be a normal driving mode. That is, when a user uses the display device 9, image frames may be displayed at no less than 20 Hz, e.g., 60 Hz.

The second driving mode may be a low-power driving mode. For example, when the user does not use the display device 9, image frames may be displayed at less than 20 Hz, e.g., 1 Hz. For example, a case where only a time and a date are displayed in an "always on mode" of a commercial mode may correspond to the second driving mode.

In the first driving mode, one period may include a plurality of image frames. The one period is an arbitrarily defined period, and is a period defined to compare the first driving mode with the second driving mode. The one period may mean the same time interval in the first and second driving modes.

In the first driving mode, each image frame may include a data write period WP and an emission period EP.

In the first driving mode, a control signal PEN applied to the control line PENL may maintain a turn-on level during one period including a plurality of image frames. Referring to FIGS. 6 and 12, the transistor M8 of which gate electrode is coupled to the control line PENL is an N-type transistor, and therefore, the turn-on level may be a low level.

When the control signal PEN maintains the turn-on level, the driving methods described in FIGS. 7 and 13 may be applied to the plurality of image frames of the one period. Therefore, the scan driver 30Nb may output scan signals having the turn-on level in the plurality of image frames.

Hereinafter, a driving method of the pixel PXnm with respect to one arbitrary image frame in one period will be described with reference to FIG. 16. The same driving method may also be applied to other image frames in the one period, and therefore, overlapping descriptions will be omitted.

Figure 16:
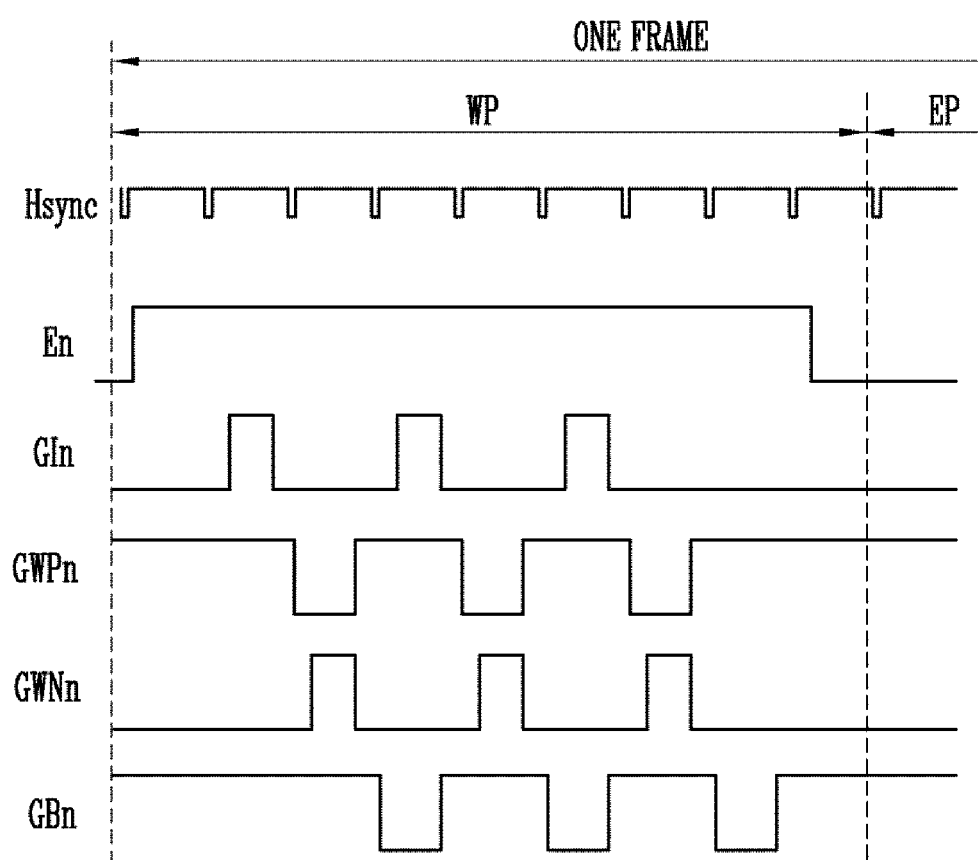
FIG. 16 is a diagram illustrating a data write period of the pixel according to some example embodiments of the present disclosure.

FIG. 16 is a diagram illustrating a data write period of the pixel according to some example embodiments of the present disclosure.

As described above, in the first driving mode, one image frame may include a data write period WP and an emission period EP. However, the data write period WP and the emission period EP of this embodiment is related to a specific pixel PXnm, and therefore, a data write period and an emission period of another pixel coupled to another scan line may be different from those of the pixel PXnm.

First, an emission signal En having a turn-off level (high level) may be supplied to the emission line ELn during the data write period WP. Therefore, the transistors T5 and T6 may be in the turn-off state during the data write period WP.

Next, a first pulse having a turn-on level (high level) is supplied to the scan line GILn. Therefore, the transistor T4 is turned on, and the gate electrode of the transistor T1 and the initialization line VINTL are coupled to each other. Accordingly, the voltage of the gate electrode of the transistor T1 is initialized to an initialization voltage of the initialization line VINTL, and is maintained by the storage capacitor Cst. For example, the initialization voltage of the initialization line VINTL may be a voltage sufficiently lower than that of the power line ELVDDL. For example, the initialization voltage may be a voltage having a level similar to that of the voltage of the power line ELVSSL.

Next, first pulses having the turn-on level are supplied to the scan lines GWPLn and GWNLn, and corresponding transistors T2 and T3 are turned on. Accordingly, a data voltage applied to the data line DLm is write in the storage capacitor Cst through the transistors T2, T1, and T3. However, the data voltage is a data voltage of a previous pixel before last. The data voltage is not used for emission of the pixel PXnm but used to apply an on-bias voltage to the transistor T1. When the on-bias voltage is applied before an actual data voltage is written to the transistor T1, a hysteresis phenomenon can be prevented.

Next, a first pulse having a turn-on level (low level) is supplied to the scan line GBLn, and the transistor T7 is turned on. Therefore, an anode voltage of the light emitting diode LD is initialized.

A second pulse having the turn-on level (high level) is supplied to the scan line GILn, and the described-above driving process is again performed. That is, the on-bias voltage is again applied to the transistor T1, and the anode voltage of the light emitting diode LD is initialized.

When third pulses having the turn-on level are supplied to the scan lines GWPLn and GWNLn by repeating the above-described process, a data voltage of the pixel PXnm is written in the storage capacitor Cst. The data voltage written in the storage capacitor Cst is a voltage obtained by reflecting a decrement of a threshold voltage of the transistor T1.

Finally, when the emission signal En becomes the turn-on level (low level), the transistors T5 and T6 become a turn-on state. Accordingly, a driving current path is formed, through which the power line ELVDDL, the transistors T5, T1, and T6, the light emitting diode LD, and the power line ELVSSL are coupled, and a driving current flows through the driving current path. An amount of driving current corresponds to the data voltage stored in the storage capacitor Cst. Because the driving current flows through the transistor T1, a decrement of the threshold voltage of the transistor T1 is reflected. Accordingly, the decrement of the threshold voltage, which is reflected to the data voltage stored in the storage capacitor Cst, and the decrement of the threshold voltage, which is reflected to the driving current, are cancelled with each other, and thus a driving current corresponding to the data voltage can flow regardless of the threshold voltage of the transistor T1.

The light emitting diode LD emits light with a desired luminance according to the amount of driving current.

In some example embodiments, a case where each scan signal includes three pulses is described. However, according to some example embodiments, each scan signal may include two or four or more pulses. Additionally, according to some example embodiments, each scan signal may be configured to include one pulse, and therefore, the process of applying the on-bias voltage to the transistor T1 is omitted.

Figure 17:
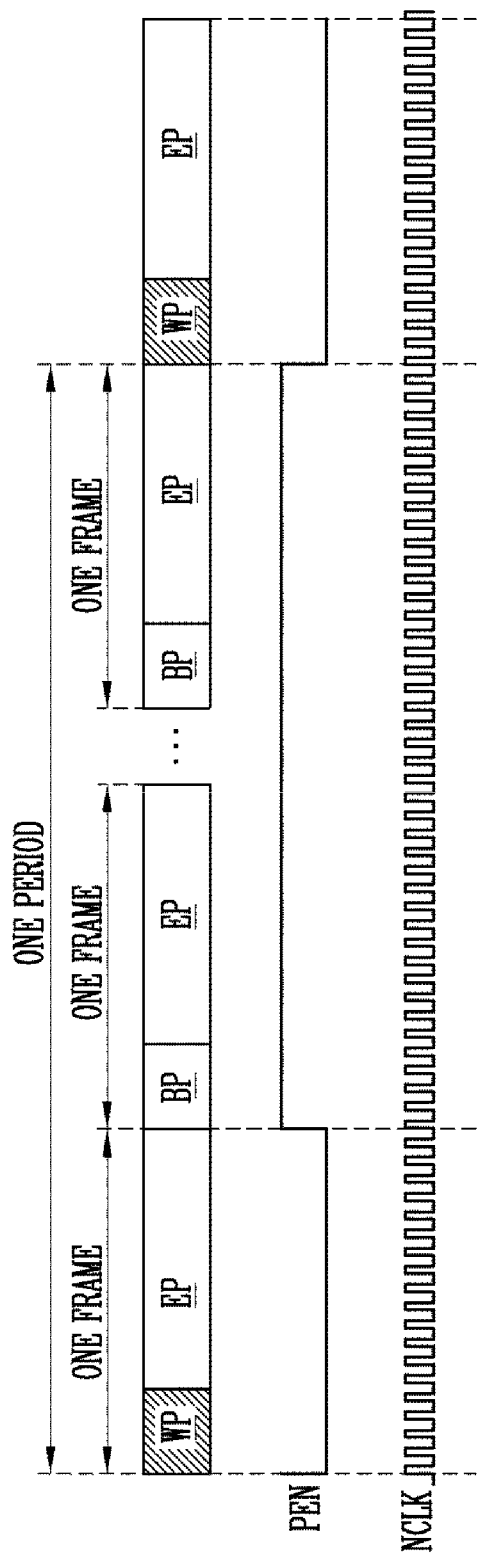
FIG. 17 is a diagram illustrating a low-frequency driving method according to some example embodiments of the present disclosure.

FIG. 17 is a diagram illustrating a low-frequency driving method according to some example embodiments of the present disclosure.

In the second driving mode, one image frame in one period includes a data write period WP and an emission period EP, and each of other image frames in the one period includes a bias period BP and an emission period EP.

In the second driving mode, a control signal Pen may maintain a turn-on level (low level) during a partial period of the one image frame in the one period, and maintain a turn-off level (high level) in the other image frames in the one period.

An image frame in which the control signal PEN having the turn-on level refers to the descriptions shown in FIGS. 15 and 16.

When the control signal PEN having the turn-off level is supplied, referring to FIGS. 6 and 12, the node N2 continuously maintains the high level, and the transistor M2 maintains the turn-off state. Therefore, the scan driver 30Nb does not output scan signals having the turn-on level in the other image frames in the one period.

Thus, the transistors T3 and T4 of the pixel PXnm maintain the turn-off state in the other image frames in the one period, and accordingly, the storage capacitor Cst maintains the same data voltage during a plurality of image frames. In particular, the transistors T3 and T4 can be configured as oxide semiconductor transistors, and thus leakage current can be minimized.

Accordingly, the pixel PXnm can display the same image during the one period, based on a data voltage supplied during the data write period WP of the one image frame in the one period.

Figure 18:
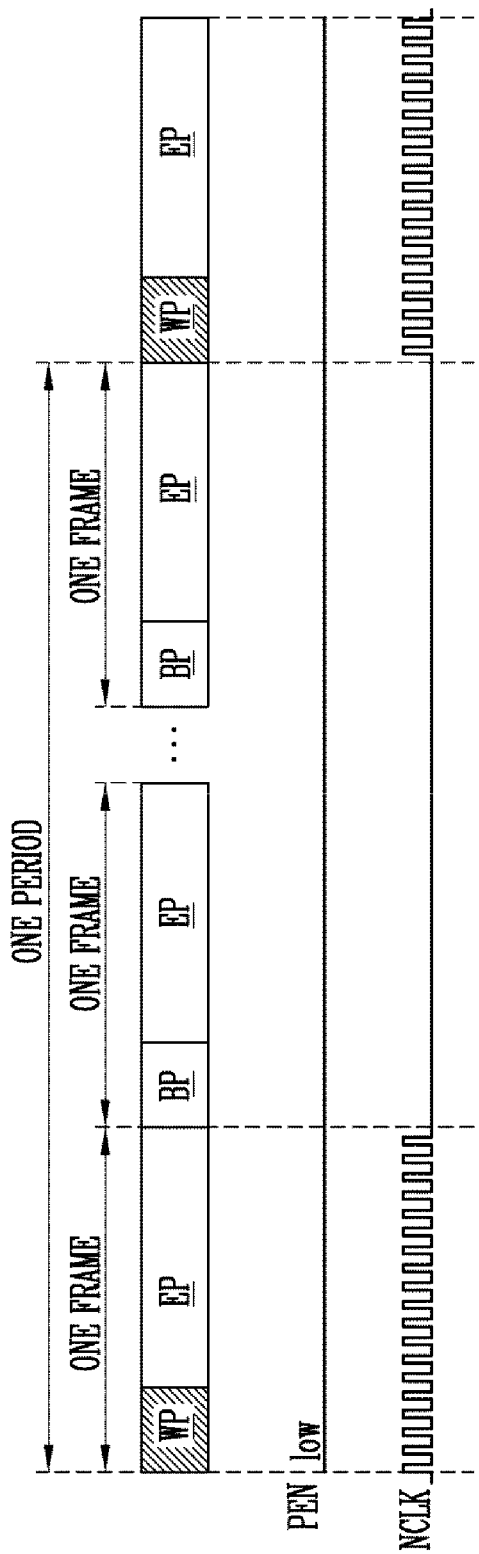
FIG. 18 is a diagram illustrating a low-frequency driving method according to some example embodiments of the present disclosure.

FIG. 18 is a diagram illustrating a low-frequency driving method according to some example embodiments of the present disclosure.

Referring to FIG. 18, a control signal PEN maintains the turn-on level during one period. A clock signal NCLK input to a clock line includes pulses during a partial period of one image frame in the one period, and may not include pulses in other image frames in the one period.

For example, the clock signal NCLK may correspond to clock signals NCLK1, NCLK2, NCLK3, and NCLK4. That is, in this embodiment, the transistor M8 of each scan stage maintains the turn-on state, and the clock signals NCLK1, NCLK2, NCLK3, and NCLK4 having the turn-on level (high level) are not supplied to the one electrode of the transistor M2, so that the scan driver 30Nb does not output scan signal having the turn-on level in the other image frames in the one period.

Thus, the transistors T3 and T4 of the pixel PXnm maintain the turn-off state in the other image frames in the one period. Accordingly, the pixel PXnm can display the same image during the one period, based on a data voltage supplied during the data write period WP of the one image frame in the one period.

Figure 19:
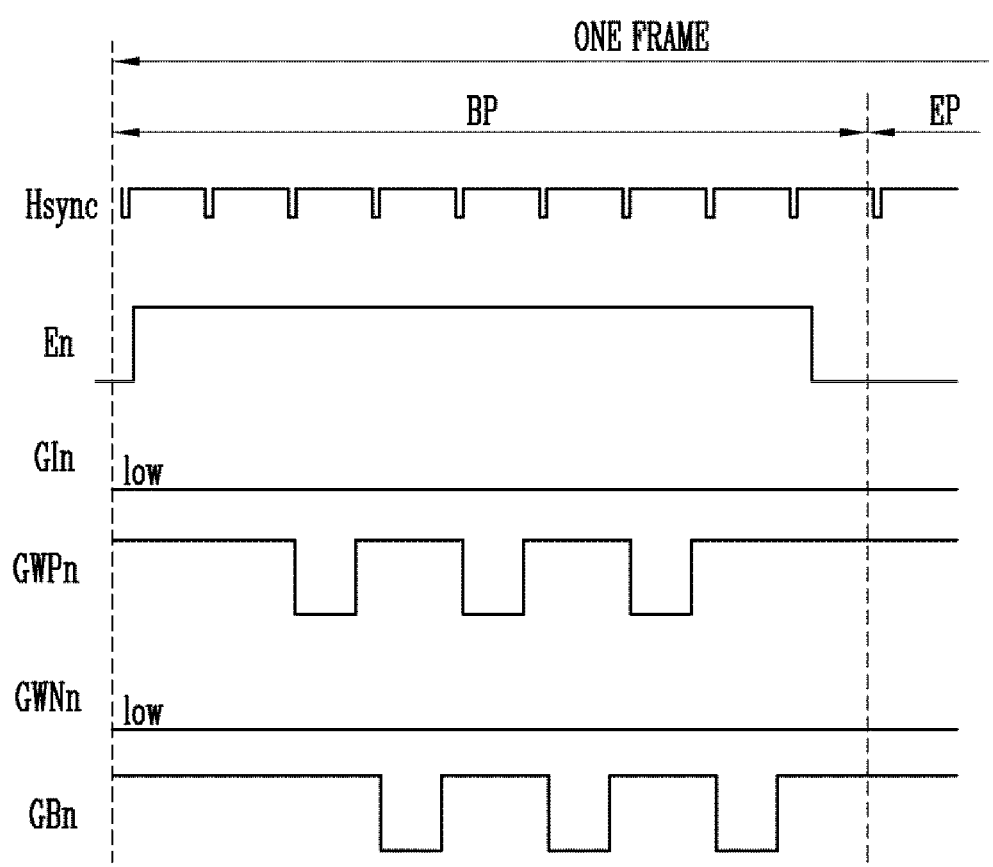
FIG. 19 is a diagram illustrating a bias period of the pixel according to some example embodiments of the present disclosure.

FIG. 19 is a diagram illustrating a bias period of the pixel according to some example embodiments of the present disclosure.

Referring to FIG. 19, in the bias period BP, scan signals Gin and GWNn having a turn-off (low level) are supplied. Therefore, as described above, a data voltage stored in the storage capacitor Cst is not changed in the bias period BP.

However, in the bias period BP and the data write period WP, the same emission signal En and the same scan signals GWPn and GBn are supplied. A reference data voltage may be applied to the data line DLm. For this reason, wavelengths of lights output from the light emitting diode LD are similar to each other between a plurality of frames of one period, so that a flicker is not viewed by a user in low-frequency driving.

According to some example embodiments of the present disclosure, the scan driver can supply a scan signal having a turn-on level with respect to an N-type transistor.

Aspects of some example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A scan stage comprising:
   a first transistor having a first electrode coupled to an output scan line, a second electrode coupled to a first power line, and a gate electrode coupled to a first node;
   a second transistor having a first electrode coupled to a first clock line, a second electrode coupled to the output scan line, and a gate electrode coupled to a second node;
   a third transistor having a first electrode coupled to the first node, a second electrode coupled to a first input scan line, and a gate electrode coupled to a second clock line;
   a fourth transistor having a first electrode, a second electrode, and a gate electrode, the second electrode and the gate electrode coupled to a second input scan line; and
   fifth transistor having a first electrode coupled to the second node, a second electrode coupled to the first electrode of the fourth transistor, and a gate electrode coupled to a control line,
   wherein the first input scan line and the second input scan line are different from each other.

2. The scan stage of claim 1, further comprising:
   a sixth transistor having a first electrode coupled to the first clock line, a second electrode coupled to the second node, and a gate electrode coupled to the first node; and
   a first capacitor having a first electrode coupled to the first clock line and a second electrode coupled to the second node.

3. The scan stage of claim 2, further comprising:
   a second capacitor having a first electrode coupled to a third node and a second electrode coupled to the first node; and
   a seventh transistor having a first electrode coupled to the third node, a second electrode coupled to a third clock line, and a gate electrode coupled to the first node.

4. The scan stage of claim 3, further comprising an eighth transistor having a first electrode coupled to a second power line, a second electrode coupled to the third node, and a gate electrode coupled to a fourth clock line.

5. The scan stage of claim 4, further comprising a ninth transistor having a first electrode coupled to the first node, a second electrode coupled to the first electrode of the third transistor, and a gate electrode coupled to the first power line.

6. The scan stage of claim 5, further comprising a tenth transistor having a first electrode coupled to the second power line, a second electrode coupled to the second electrode of the fourth transistor, and a gate electrode coupled to the second input scan line.

7. The scan stage of claim 6, further comprising an eleventh transistor having a first electrode coupled to the second electrode of the fourth transistor, a second electrode coupled to the first power line, and a gate electrode coupled to the second input scan line.

8. The scan stage of claim 4, wherein pulses of a first scan signal input to the first input scan line have a phase faster than that of pulses of a second scan signal input to the second input scan line.

9. The scan stage of claim 8, wherein the pulses of the second scan signal overlap with some pulses of a first clock signal input to the first clock line for a partial time.

10. The scan stage of claim 9, wherein the pulses of the first scan signal input to the first input scan line have a phase faster than that of the pulses of the second scan signal input to the second input scan line, and
    wherein the pulses of the first scan signal and the pulses of the second scan signal have a same polarity.

11. The scan stage of claim 9, wherein times at which the pulses of the second scan signal are generated are prior to those at which the some pulses of the first clock signal are generated.

12. The scan stage of claim 11, wherein a second clock signal input to the second clock line has a same period length as a third clock signal input to the third clock line, but has a phase faster than that of the third clock signal.

13. The scan stage of claim 12, wherein the pulses of the first clock signal have a polarity opposite to that of pulses of the third clock signal,
    wherein the pulses of the first clock signal and the pulses of the third clock signal overlap with each other for a partial time, and
    wherein the pulses of the first clock signal have a phase delayed from that of the pulses of the third clock signal.

14. The scan stage of claim 13, wherein a fourth clock signal is input to the fourth clock line,
    wherein pulses of the fourth clock signal have a polarity opposite to that of the pulses of the first clock signal,
    wherein the pulses of the fourth clock signal and the pulses of the first clock signal overlap with each other for a partial time, and
    wherein the pulses of the fourth clock signal have a phase delayed from that of the pulses of the first clock signal.

15. The scan stage of claim 12, wherein the pulses of the first clock signal have a polarity opposite to that of the pulses of the third clock signal,
    wherein the pulses of the first clock signal are generated for times at which the pulses of the third clock signal are generated, and
    wherein the times at which the pulses of the first clock signal are generated are delayed from those at which the pulses of the third clock signal are generated.

16. The scan stage of claim 15, wherein a fourth clock signal is input to the fourth clock line,
    wherein pulses of the fourth clock signal have a polarity opposite to that of the pulses of the first clock signal, and wherein the pulses of the fourth clock signal do not temporally overlap with the pulses of the first clock signal.

17. The scan stage of claim 4, wherein, in a first driving mode, a control signal applied to the control line maintains a turn-on level during one period including a plurality of image frames.

18. The scan stage of claim 17, wherein, in a second driving mode different from the first driving mode, the control signal maintains the turn-on level during a partial period of the one period, and maintains a turn-off level during another partial period of the one period.

19. The scan stage of claim 17, wherein, in a second driving mode different from the first driving mode, the control signal maintains the turn-on level during the one period, and wherein the first clock signal input to the first clock line includes pulses during a partial period of the one period, and does not include the pulses during another partial period of the one period.

20. The scan stage of claim 3, further comprising an eighth transistor having a first electrode coupled to the third clock line, a second electrode coupled to the third node, and a gate electrode coupled to a fourth clock line.

* * * * *